(12) United States Patent
Lin et al.

(10) Patent No.: US 11,799,006 B2
(45) Date of Patent: Oct. 24, 2023

(54) MASK-FREE PROCESS FOR IMPROVING DRAIN TO GATE BREAKDOWN VOLTAGE IN SEMICONDUCTOR DEVICES

(71) Applicant: Taiwan Semiconductor Manufacturing Company Limited, Hsinchu (TW)

(72) Inventors: Meng-Han Lin, Hsinchu (TW); Te-An Chen, Beitun (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 87 days.

(21) Appl. No.: 17/302,846

(22) Filed: May 13, 2021

(65) Prior Publication Data

US 2022/0367652 A1 Nov. 17, 2022

(51) Int. Cl.
*H01L 29/423* (2006.01)
*H01L 21/8234* (2006.01)
*H01L 21/265* (2006.01)
*H01L 29/06* (2006.01)

(52) U.S. Cl.
CPC ...... *H01L 29/42364* (2013.01); *H01L 21/265* (2013.01); *H01L 21/823468* (2013.01); *H01L 29/0611* (2013.01)

(58) Field of Classification Search
CPC .................. H10B 41/49; H01L 21/823462
See application file for complete search history.

(56) References Cited

U.S. PATENT DOCUMENTS

| 11,107,917 | B2 | 8/2021 | Hsu et al. | |
| 2008/0293207 | A1* | 11/2008 | Koutny, Jr. | H10B 99/00 |
| | | | | 257/E21.409 |
| 2017/0179145 | A1* | 6/2017 | Chee | H10B 43/30 |
| 2019/0371806 | A1 | 12/2019 | Ramkumar | |
| 2021/0083109 | A1* | 3/2021 | Hsu | H01L 29/665 |

FOREIGN PATENT DOCUMENTS

TW 201924028 A 6/2019
TW I698017 B 7/2020

* cited by examiner

*Primary Examiner* — Raj R Gupta
(74) *Attorney, Agent, or Firm* — Harrity & Harrity, LLP

(57) ABSTRACT

A semiconductor device may include a first device on a first portion of a substrate, a second device on a second portion of the substrate, and a third device on a third portion of the substrate. The third device may include an oxide layer that is formed from an oxide layer that is a sacrificial oxide layer for the first device and the second device. The third device may include a gate provided on the oxide layer, a set of spacers provided on opposite sides of the gate, and a source region provided in the third portion of the substrate on one side of the gate. The third device may include a drain region provided in the third portion of the substrate on another side of the gate, and a protective oxide layer provided on a portion of the gate and a portion of the drain region.

20 Claims, 23 Drawing Sheets

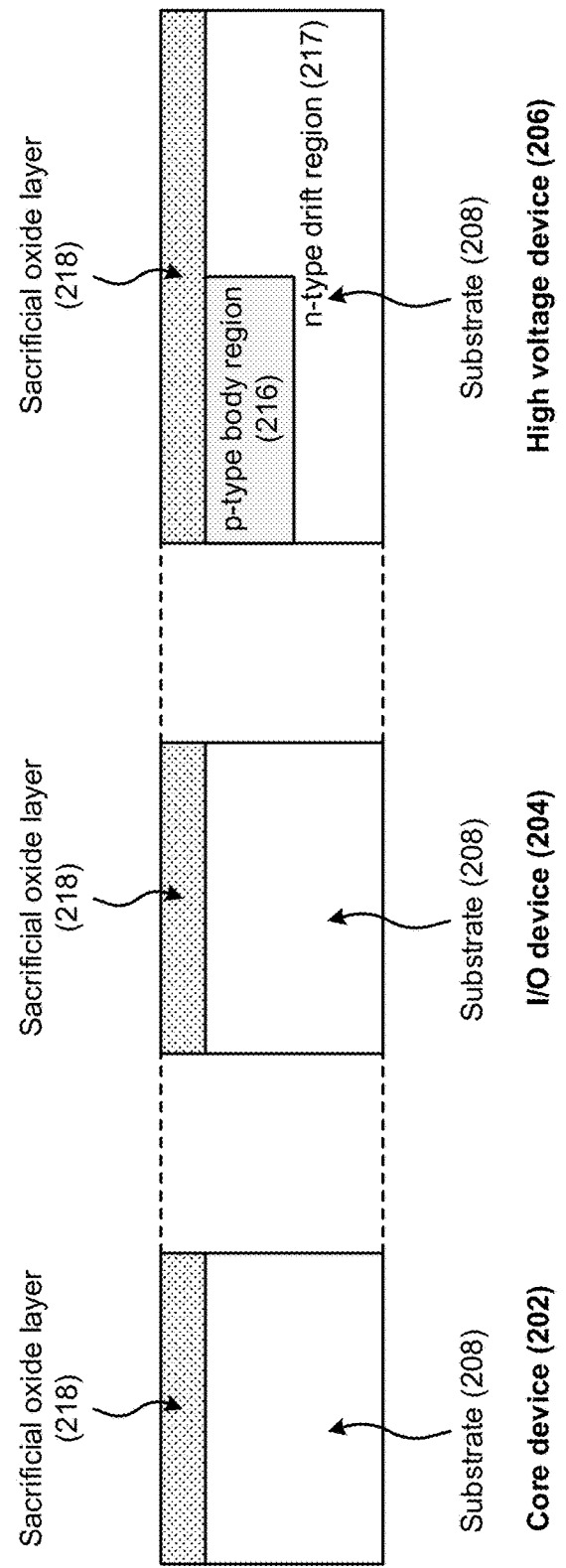

MASK-FREE PROCESS FOR IMPROVING DRAIN TO GATE BREAKDOWN VOLTAGE IN SEMICONDUCTOR DEVICES

BACKGROUND

A power semiconductor device is a semiconductor device used as a switch or rectifier in power electronics (e.g., in a switch-mode power supply). Such a device is also called a power device or, when used in an integrated circuit, a power IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
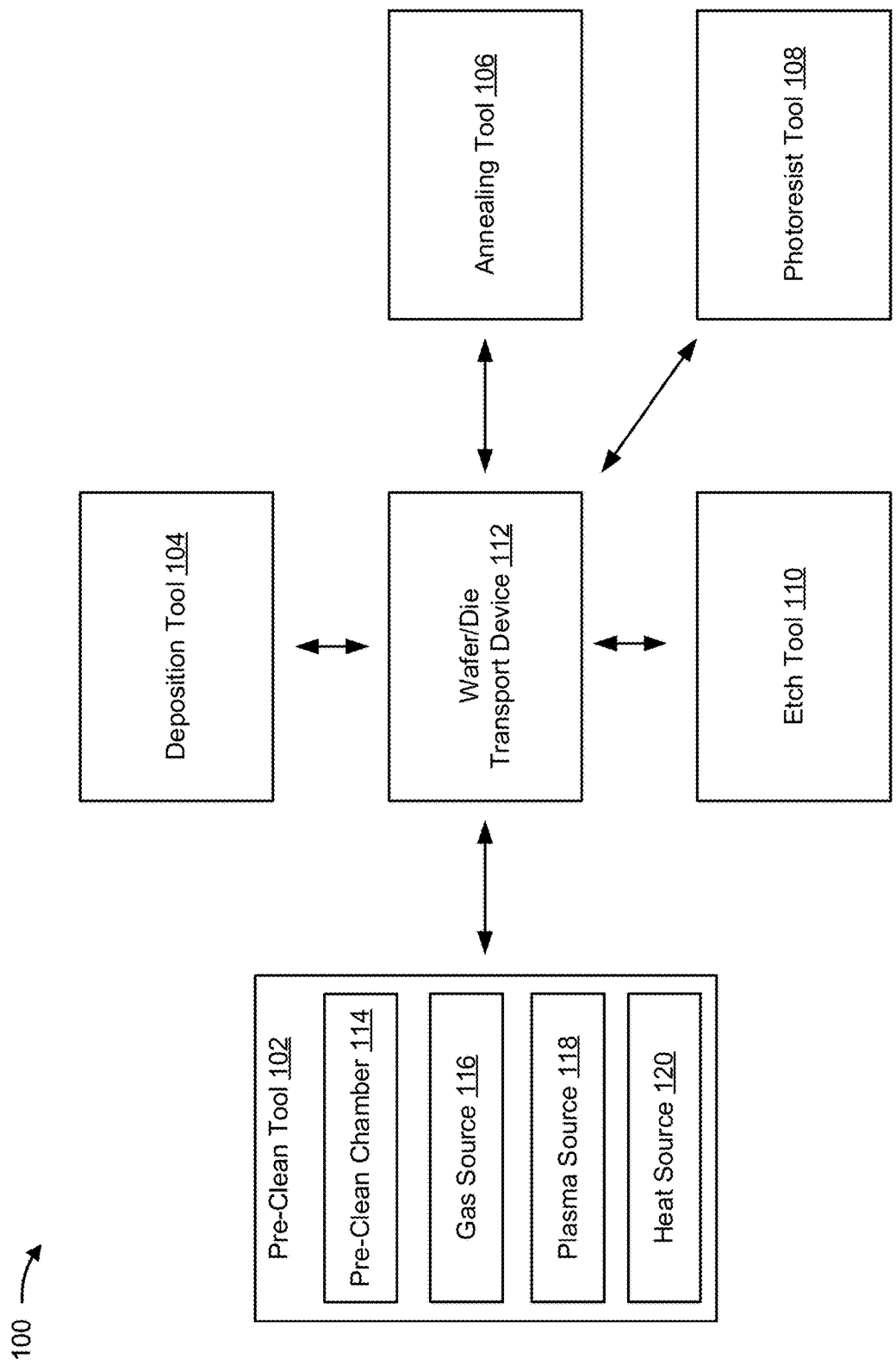
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a power semiconductor device may include a field-effect transistor (FET). A FET is a type of transistor that uses an electric field to control a flow of current. FETs include three terminals: a source, a gate, and a drain. FETs control the flow of current by applying a voltage to the gate, which in turn alters a conductivity between the drain and the source. In power semiconductor devices, drain-side drift region engineering is important for high voltage operation. However, current processes for manufacturing a power semiconductor device cause a divot near an oxide diffusion/shallow trench isolation region of the power semiconductor device. The divot causes formation of a thinner high voltage gate oxide region of the power semiconductor device, which severely degrades drain to gate breakdown voltage and limits use of the power semiconductor device for high voltage operation (e.g., an operation voltage greater than an operation voltage of an input/output device).

According to some implementations described herein, a method for manufacturing a semiconductor device (e.g., a power semiconductor device) is based on a mask-free process that improves drain to gate breakdown voltage in the semiconductor device. For example, the method may include forming or depositing a first oxide layer on a first portion, a second portion, and a third portion of a substrate, where the first oxide layer is a sacrificial oxide layer for the first portion and the second portion of the substrate. The method may include forming or depositing a first photoresist layer on the first oxide layer formed on the third portion of the substrate, and removing the first oxide layer from the first portion and the second portion of the substrate. The method may include removing the first photoresist layer from the first oxide layer formed on the third portion of the substrate, and forming or depositing a second oxide layer on the first portion and the second portion of the substrate and on the first oxide layer formed on the third portion of the substrate, where the first oxide layer and the second oxide layer on the third portion of the substrate define a modified first oxide layer on the third portion of the substrate. The method may include forming or depositing a second photoresist layer on the modified first oxide layer and on the second oxide layer formed on the second portion of the substrate, and removing the second oxide layer formed on the first portion of the substrate. The method may include forming or depositing a third oxide layer on the first portion of the substrate, removing the second photoresist layer, and forming or providing a first device on the third oxide layer formed on the first portion of the substrate. The method may include forming or providing a second device on the second oxide layer formed on the second portion of the substrate, and forming or providing a third device on the modified first oxide layer formed on the third portion of the substrate.

In this way, the method for manufacturing a semiconductor device is based on a mask-free process that improves drain to gate breakdown voltage in the semiconductor device. The method may include utilization of a sacrificial oxide (e.g., formed by an in-situ steam generation (ISSG) process) for the gate oxide region of the semiconductor device, which prevents formation of the divot-induced thinner gate oxide region. The method improves drain to gate breakdown voltage by more than two volts or by more than thirty percent (30%) over current manufacturing processes.

Thus, the semiconductor device may be utilized for high voltage operation (e.g., as a power semiconductor device). Furthermore, the method does not require an extra mask or an extra thermal budget compared to current manufacturing processes, and includes fewer process steps and reduced cycle times compared to current manufacturing processes. The method may be utilized to simultaneously manufacture core devices (e.g., for performing functions), input/output devices (e.g., for communicating the performed functions to external devices), and high voltage devices (e.g., power semiconductor devices), without affecting performances of such devices.

FIG. 1 is a diagram of an example environment 100 in which systems and/or methods described herein may be implemented. As shown in FIG. 1, environment 100 may include a pre-clean tool 102, a deposition tool 104, an annealing tool 106, a photoresist tool 108, an etch tool 110, and a wafer/die transport device 112. The tools and/or devices included in example environment 100 may be included in a semiconductor clean room, a semiconductor foundry, a semiconductor processing and/or manufacturing facility, and/or the like.

Pre-clean tool 102 includes a pre-clean chamber 114 and one or more devices capable of performing a pre-clean process on a semiconductor device to remove a byproduct layer from the semiconductor device. The one or more devices may include a gas source 116, a plasma source 118, a heat source 120, and/or the like. Gas source 116 may supply various gasses to pre-clean chamber 114, such as an ammonia gas, a nitrogen trifluoride gas, and/or the like. Plasma source 118 may generate a plasma that causes a reaction between the gasses supplied to pre-clean chamber 114. For example, plasma source 118 may include an inductively coupled plasma (ICP) source, transformer coupled plasma (TCP) source, or another type of plasma source capable of causing a reaction between an ammonia gas and a nitrogen trifluoride gas to cause the formation of an ammonium fluoride gas. Heat source 120 may be capable of heating a semiconductor device in pre-clean chamber 114 to cause one or more layers on the semiconductor device to decompose, as described herein. For example, heat source 120 may include a heat lamp, a heating coil, or another type of heating device that heats the semiconductor device to cause an ammonium fluoride layer on the semiconductor device to decompose into an ammonia gas and a hydrogen fluoride gas, as described herein.

Deposition tool 104 is a semiconductor processing tool that includes a semiconductor processing chamber and one or more devices capable of depositing various types of materials onto a semiconductor device. For example, deposition tool 104 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), an ion implantation device, and/or the like. In some implementations, deposition tool 104 may deposit a metal layer onto a source region or a drain region of a semiconductor device, may deposit a contact material to form a contact of a semiconductor device, and/or the like as described herein.

Annealing tool 106 is a semiconductor processing tool that includes a semiconductor processing chamber and one or more devices capable of heating a semiconductor device. For example, annealing tool 106 may include an rapid thermal annealing (RTA) tool or another type of annealing tool that is capable of heating a semiconductor device to cause a reaction between two or more materials or gasses, to cause a material to decompose, and/or the like. For example, annealing tool 106 may heat a semiconductor device to cause a metal layer on an epitaxial region (e.g., a source region or a drain region) to react and form a metal silicide layer, as described herein.

Photoresist tool 108 is a semiconductor processing tool that removes materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. Photoresist tool 108 may coat the semiconductor device with a photo-sensitive organic material, and may apply a patterned mask to the semiconductor device to block light, so that only unmasked regions of the photo-sensitive organic material will be exposed to light. Photoresist tool 108 or another tool (e.g., etch tool 110) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed.

Etch tool 110 is a semiconductor processing tool that removes materials from a surface of a semiconductor device. In some implementations, a portion of the semiconductor device is protected from an etchant by a masking material that resists etching. For example, the masking material may include a photoresist that is patterned using photolithography. Etch tool 110 may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.01 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetra fluorine may be utilized to etch silicon and chlorine may be utilized to etch aluminum, trifluoro methane may be used to etch silicon dioxide and silicon nitride, and/or the like. The plasma may also include oxygen that is used to oxidize photoresist and facilitate removal of the photoresist.

Wafer/die transport device 112 includes a mobile robot, a robot arm, a tram or rail car, and/or another type of device that are used to transport wafers and/or dies between semiconductor processing tools 102-110 and/or to and from other locations, such as a wafer rack, a storage room, and/or the like. In some implementations, wafer/die transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
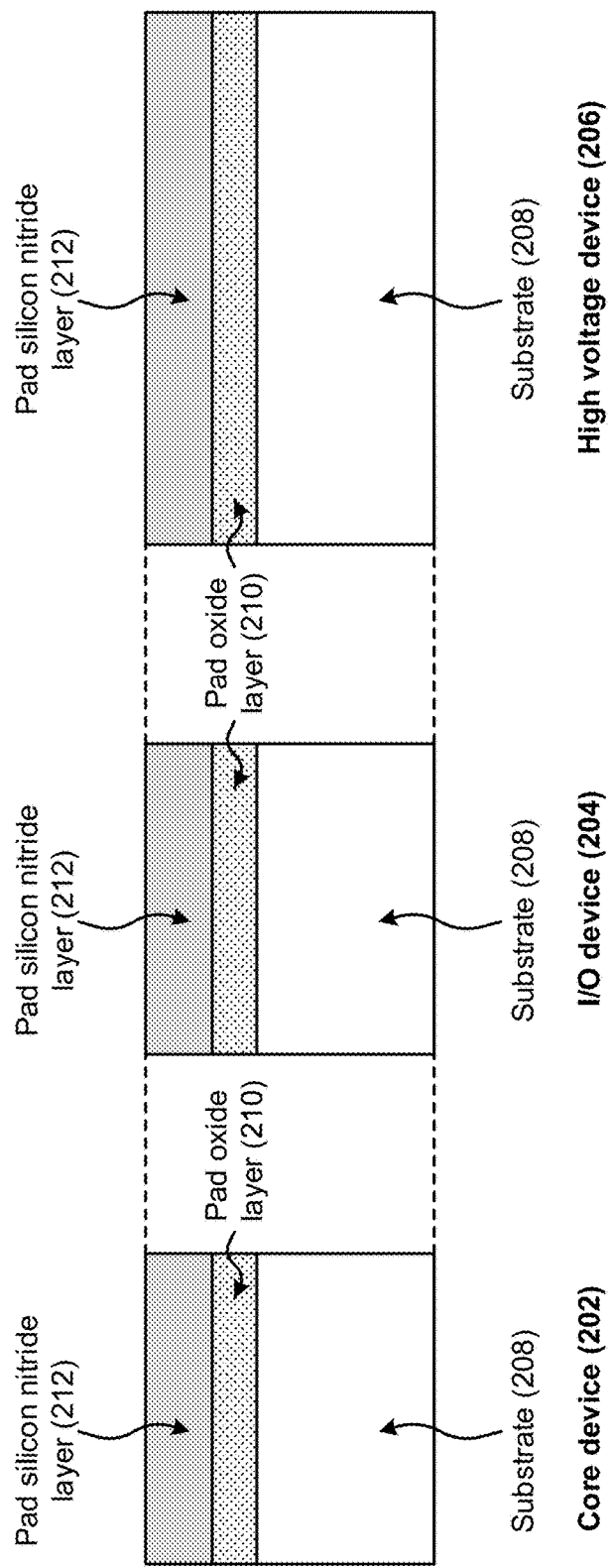
FIGS. 2A-2O are diagrams of one or more example operations involved in manufacturing example semiconductor devices described herein.
Figure 2B:
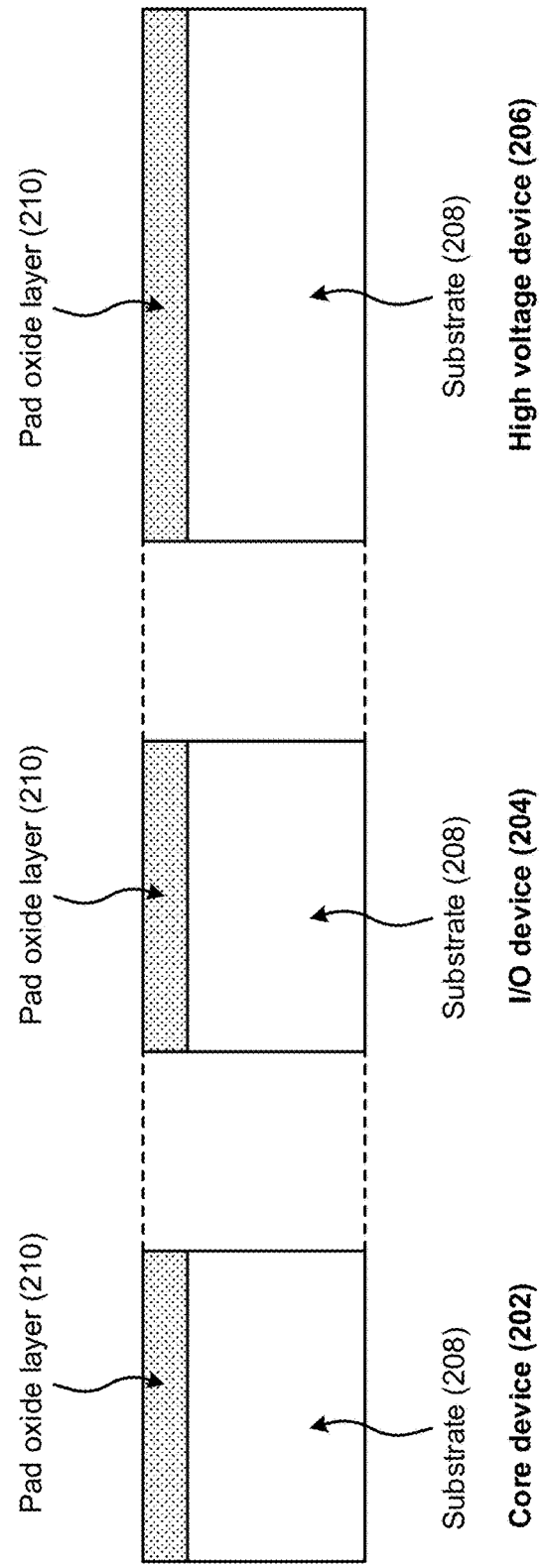
Figure 2C:
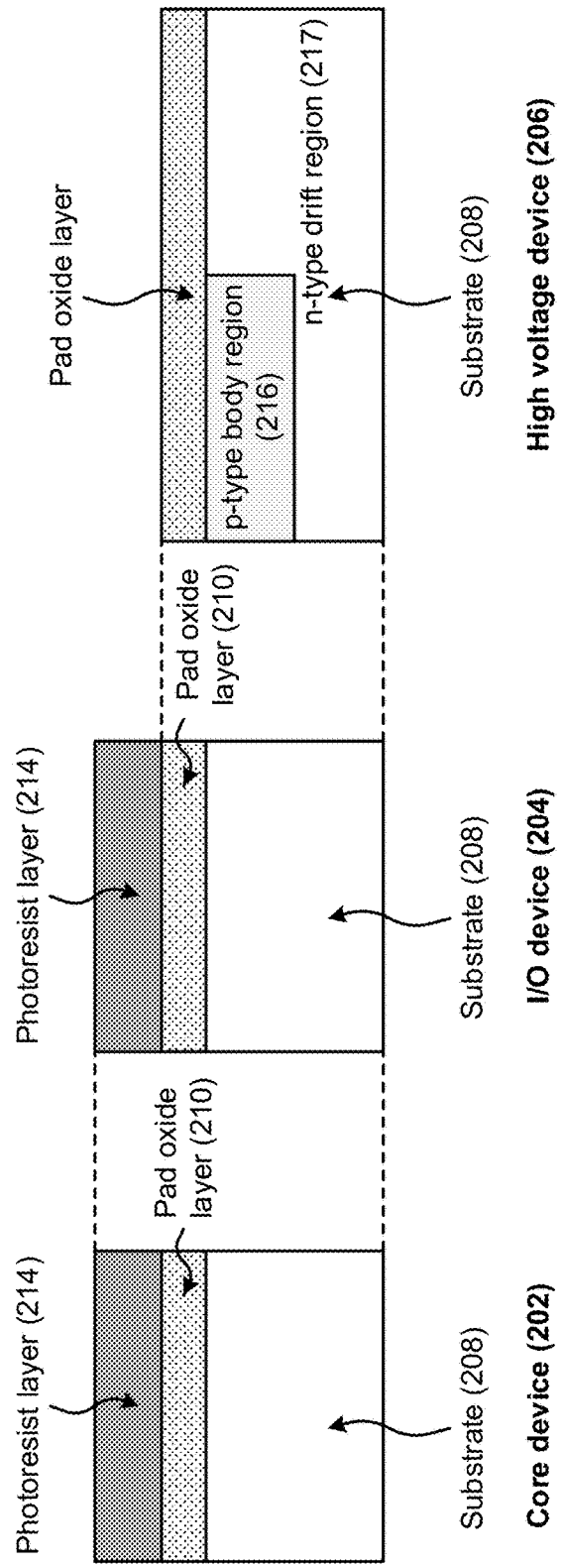
Figure 2D:
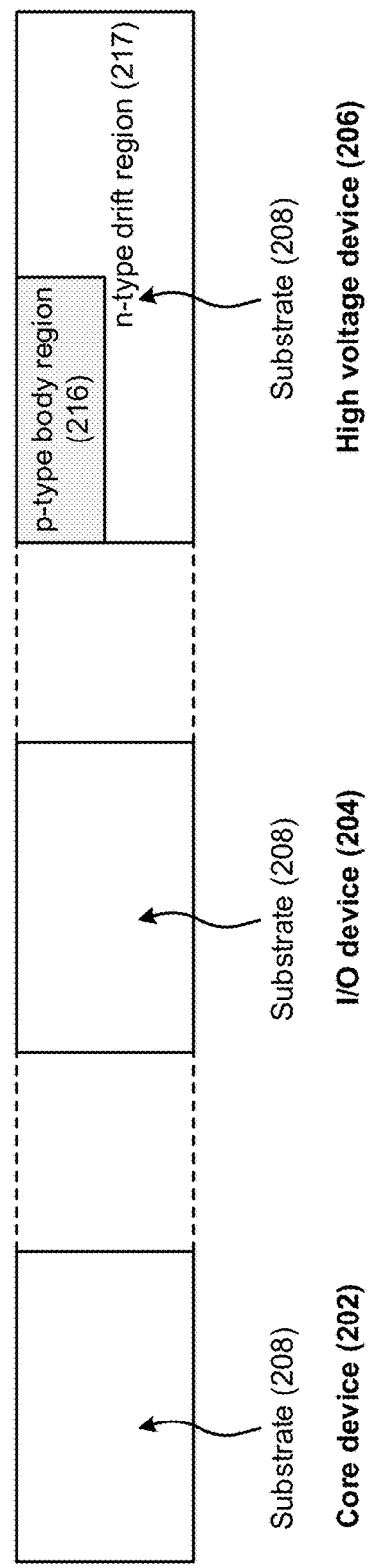
Figure 2F:
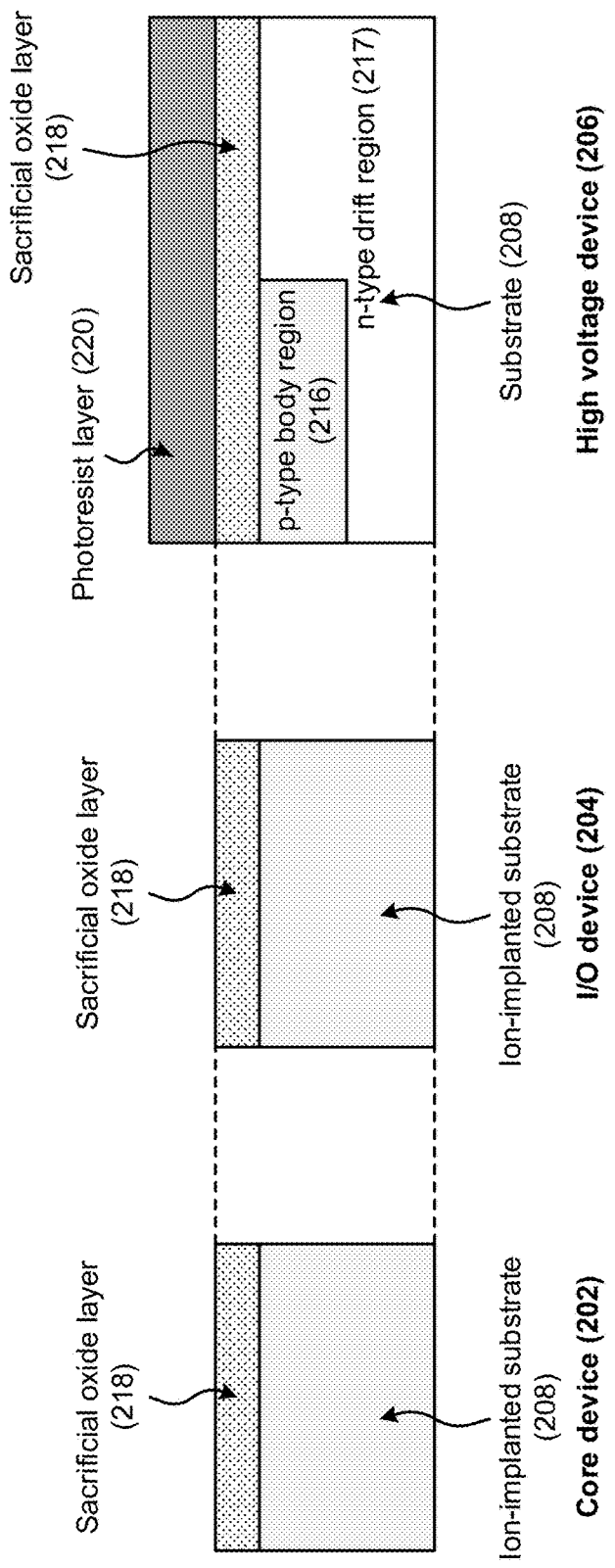
Figure 2G:
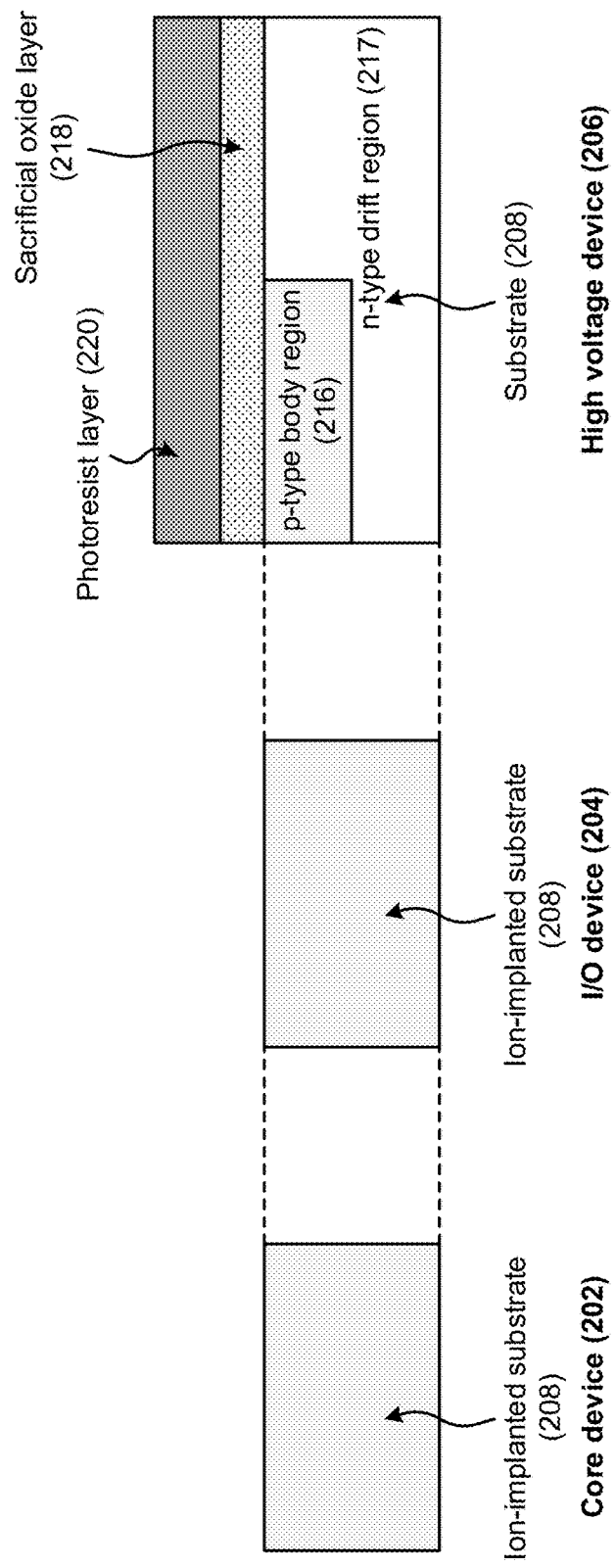
Figure 2H:
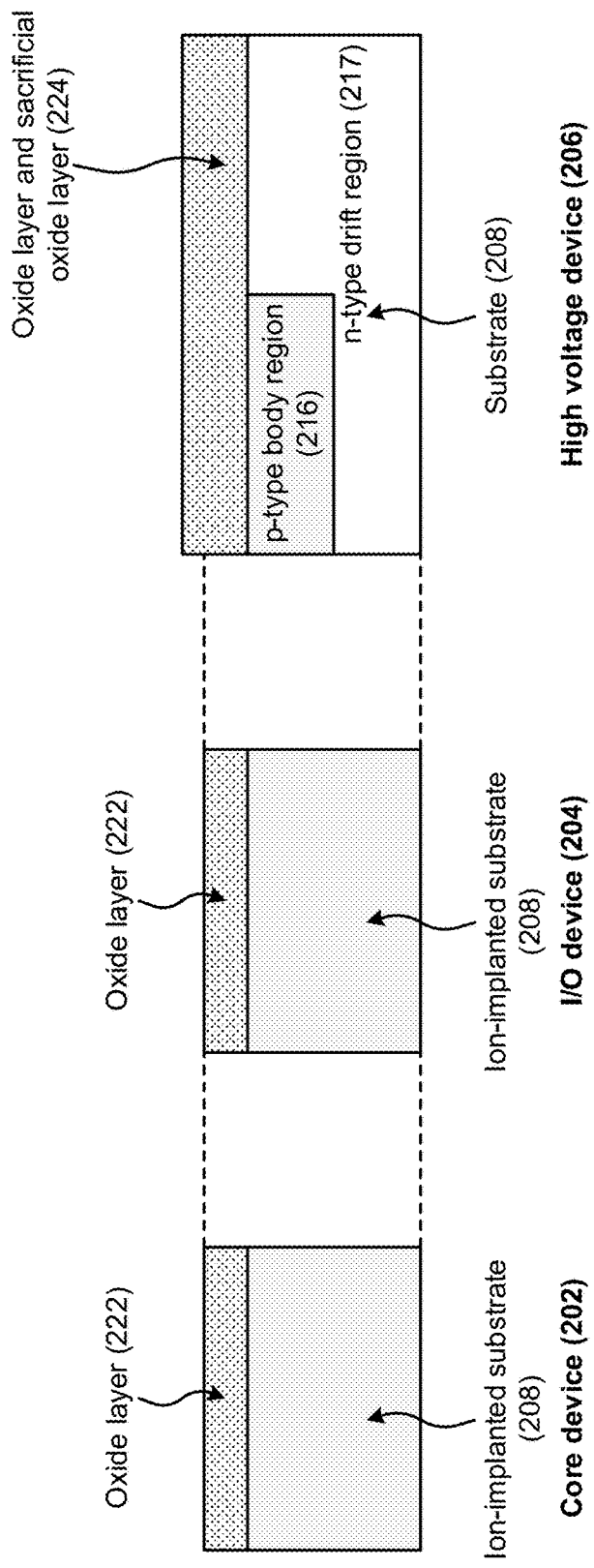
Figure 2I:
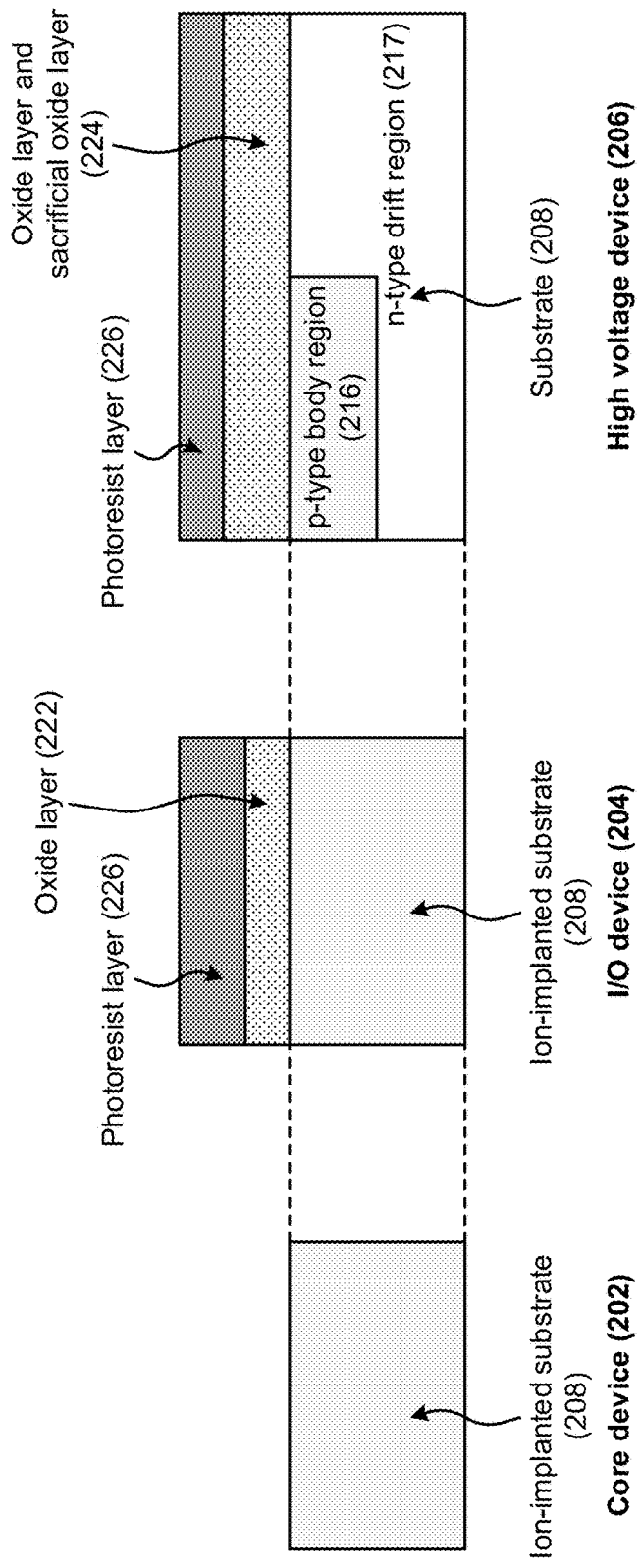
Figure 2J:
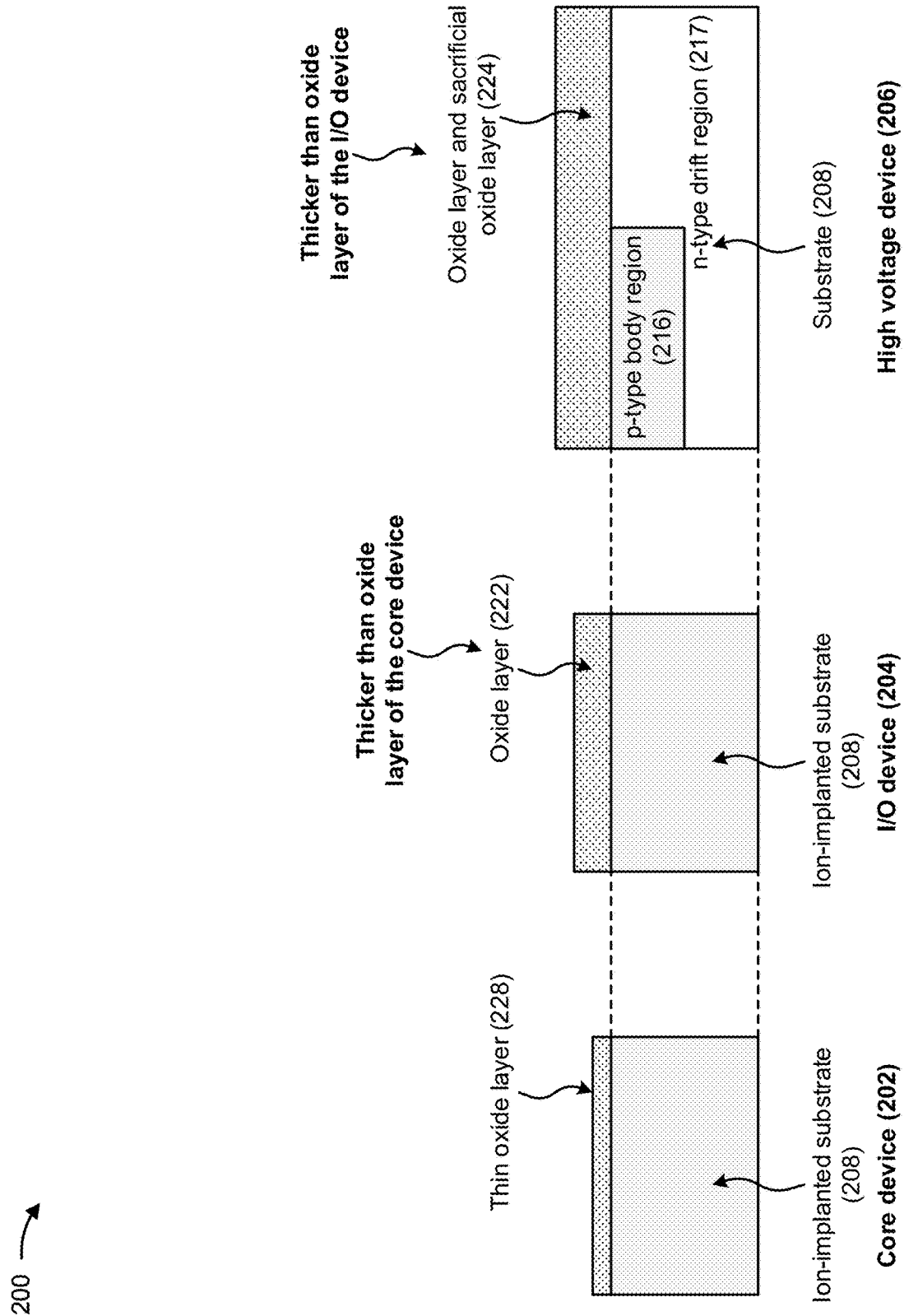
Figure 2K:
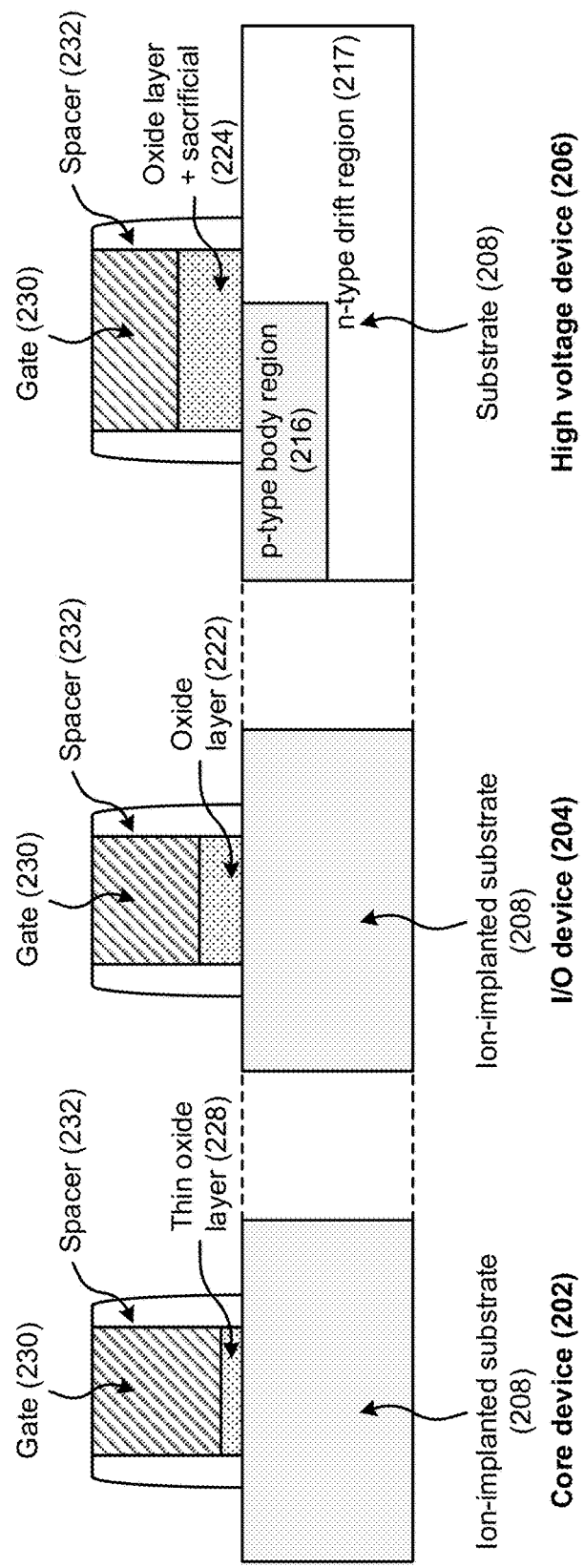
Figure 2L:
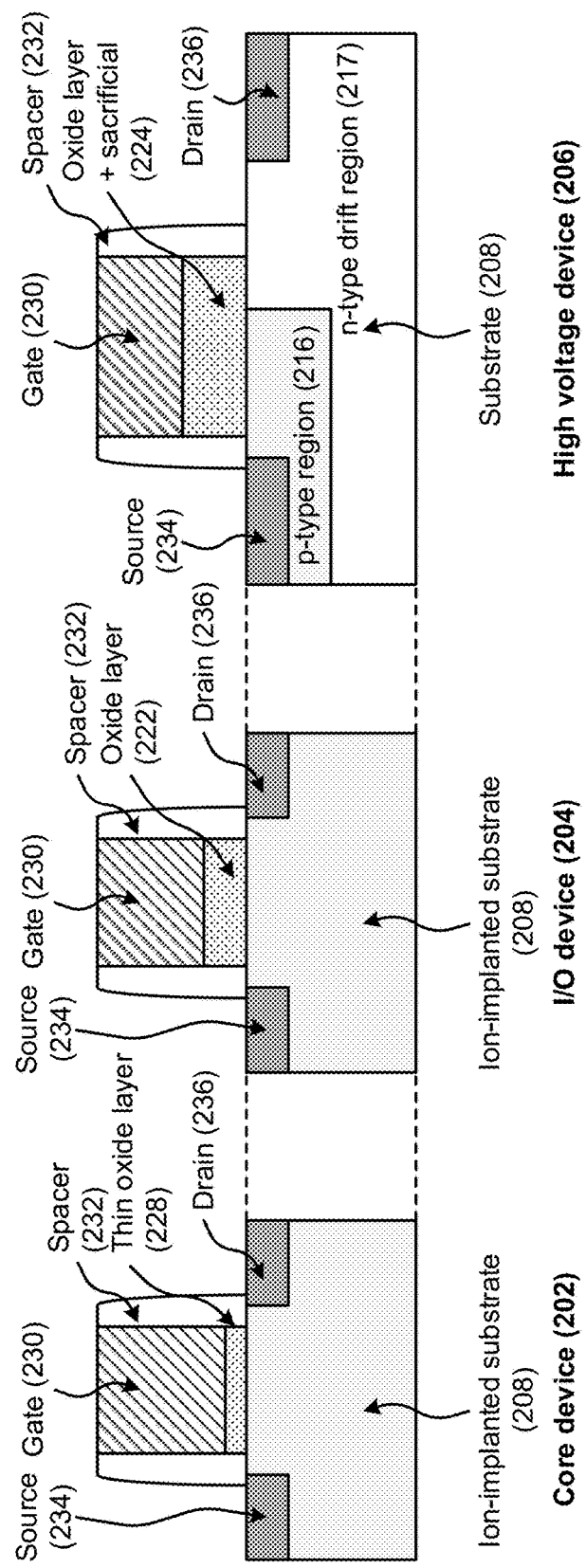
Figure 2M:
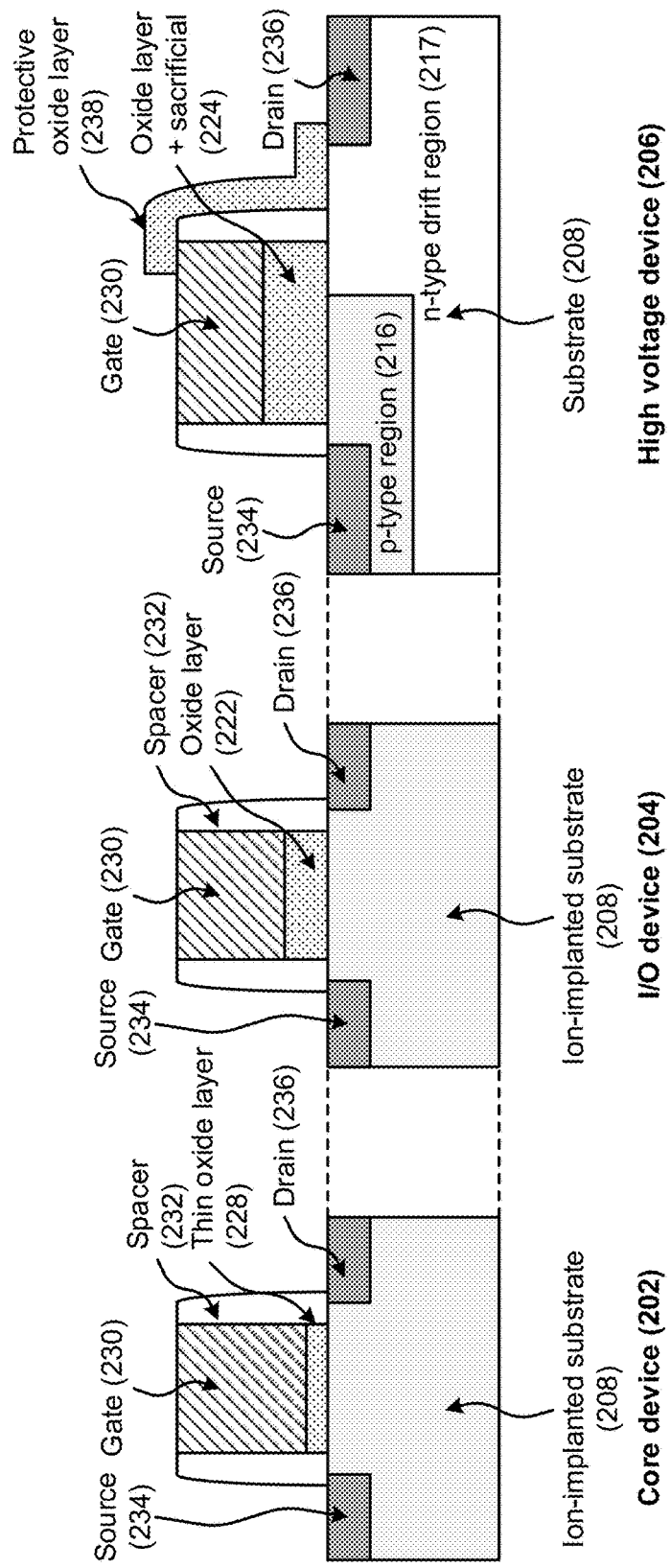
Figure 2N:
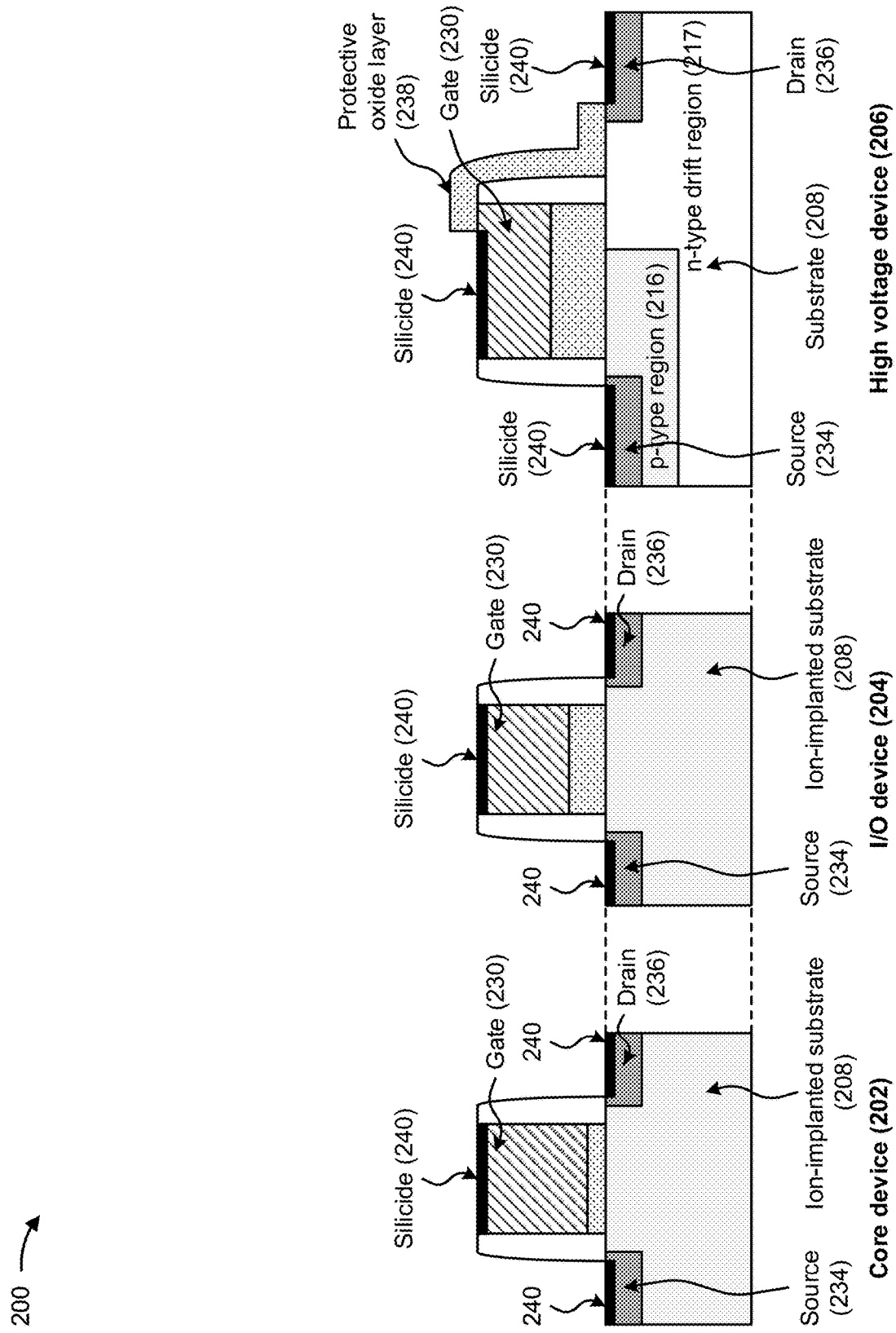
Figure 2O:
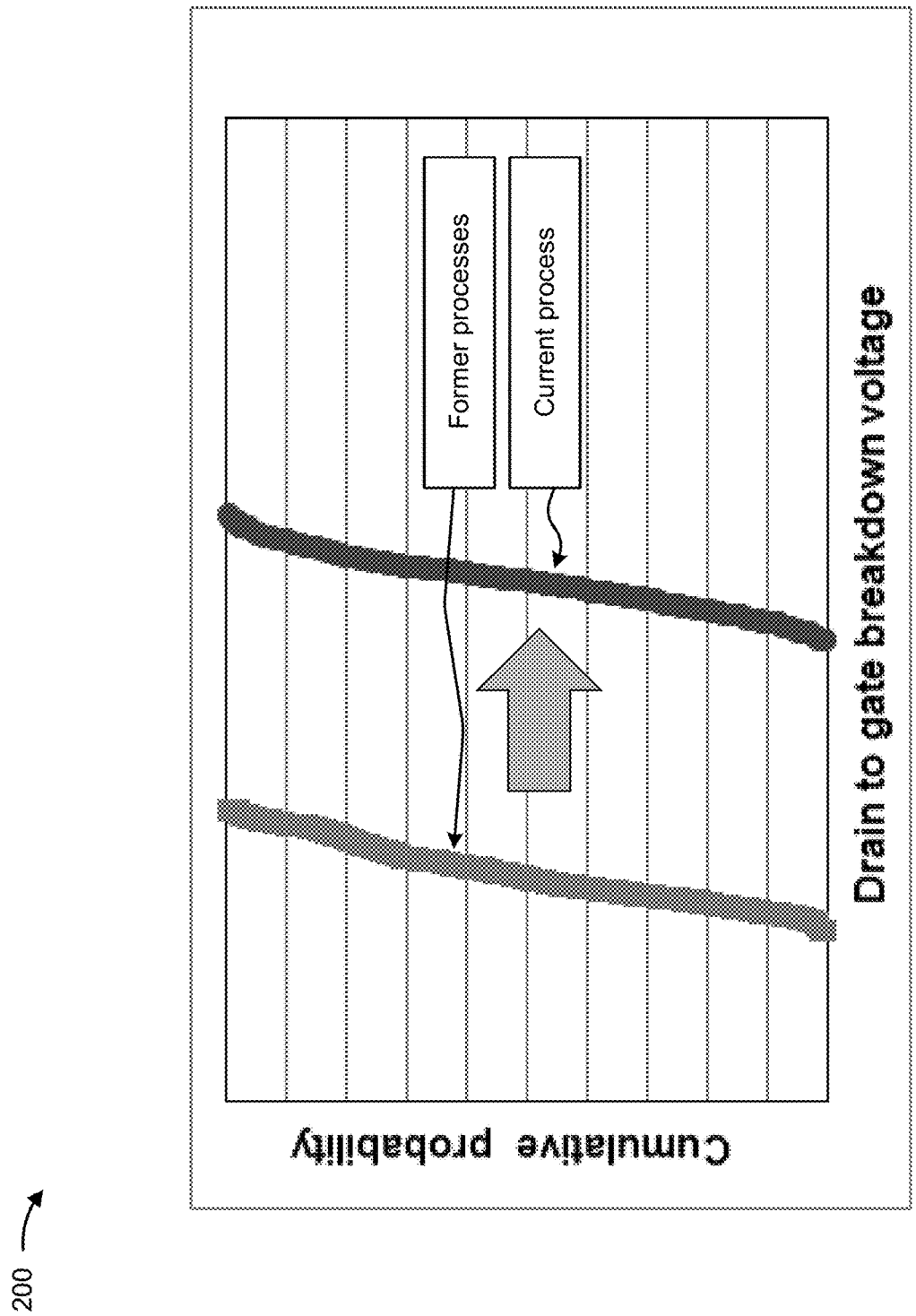

FIGS. 2A-2O are diagrams of one or more example operations 200 involved in manufacturing example semiconductor devices described herein (e.g., a logic device, a memory device, a finFET, a MOSFET, and/or the like). As shown in FIG. 2A, a semiconductor device may include a core device 202, an input/output (I/O) device 204, and a high voltage device 206. The core device 202 may include a device that performs one or more functions (e.g., logic operations, storage operations, and/or the like). The I/O device 204 may include a device that communicates the one or more functions to external devices. The high voltage device 206 may include a power semiconductor device, such as a FET that uses an electric field to control a flow of current.

As further shown in FIG. 2A, the core device 202 may be provided on a first portion of a substrate 208, the I/O device 204 may be provided on a second portion of the substrate 208, and the high voltage device 206 may be provided on a third portion of the substrate 208. The substrate 208 may include a conductive or semi-conductive material, such as silicon, aluminum, copper, and/or the like. A pad oxide layer 210 may be formed or deposited on the substrate 208, and a pad silicon nitride layer 212 may be formed or deposited on the pad oxide layer 210. The pad oxide layer 210 may include a material that is used as an isolation material for the substrate 208, such as silicon oxide, iron oxide, aluminum oxide, and/or the like. The pad silicon nitride layer 212 may be formed or deposited from silicon nitride and may act as an oxide barrier for the pad oxide layer 210.

As shown in FIG. 2B, the pad silicon nitride layer 212 may be removed from the pad oxide layer 210 of the core device 202, the I/O device 204, and the high voltage device 206. In some implementations, one or more etching operations may be performed to remove the pad silicon nitride layer 212 from the pad oxide layer 210. For example, a dry etching operation, utilizing carbon tetrafluoride gas, nitrogen trifluoride gas, chlorine gas, and/or the like, may be performed to remove the pad silicon nitride layer 212 from the pad oxide layer 210. In some implementations, etch tool 110 of environment 100, described above in connection with FIG. 1, may be utilized to remove the pad silicon nitride layer 212 from the pad oxide layer 210 of the core device 202, the I/O device 204, and the high voltage device 206.

As shown in FIG. 2C, a photoresist layer 214 may be formed or deposited on the pad oxide layer 210 of the core device 202 and the I/O device 204, but not on the pad oxide layer 210 of the high voltage device 206. The photoresist layer 214 may include a photoresist material, such as a photopolymeric photoresist (e.g., methyl methacrylate), a photodecomposing photoresist (e.g., diazonaphthaquinone), a photocrosslinking photoresist, and/or the like. In some implementations, the photoresist layer 214 is patterned on the portions of the semiconductor device (e.g., the core device 202 and the I/O device 204) to protect the substrate 208 of the core device 202 and the I/O device 204, as described below. In some implementations, photoresist tool 108 of environment 100, described above in connection with FIG. 1, may be utilized to form or deposit the photoresist layer 214 on the pad oxide layer 210 of the core device 202 and the I/O device 204.

As further shown in FIG. 2C, an ion implantation process may be performed to implant ions (e.g., through the pad oxide layer 210) in the substrate 208 of the high voltage device 206 and to form a p-type body region 216 and an n-type drift region 217 in the substrate 208 of the high voltage device 206. The p-type body region 216 may be formed by implanting trivalent acceptor impurities (e.g., boron, gallium, indium, aluminum, and/or the like) in the substrate 208 of the high voltage device 206. The n-type drift region 217 may be formed by implanting donor impurities (e.g., phosphorus, arsenic, antimony, bismuth, and/or the like) in the substrate 208 of the high voltage device 206. In some implementations, deposition tool 104 (e.g., an ion implantation tool) of environment 100, described above in connection with FIG. 1, may be utilized to implant ions in the substrate 208 of the high voltage device 206 and to form the p-type body region 216 and the n-type drift region 217 in the substrate 208 of the high voltage device 206.

As shown in FIG. 2D, the photoresist layer 214 and the pad oxide layer 210 may be removed from the core device 202 and the I/O device 204 and the pad oxide layer 210 may be removed from the high voltage device 206. In some implementations, one or more etching operations may be performed to remove the photoresist layer 214 and the pad oxide layer 210 from the core device 202 and the I/O device 204 and to remove the pad oxide layer 210 from the high voltage device 206. For example, a dry etching operation, utilizing carbon tetrafluoride gas, nitrogen trifluoride gas, chlorine gas, and/or the like, may be performed to remove the photoresist layer 214 and the pad oxide layer 210 from the core device 202 and the I/O device 204 and to remove the pad oxide layer 210 from the high voltage device 206. In some implementations, etch tool 110 of environment 100, described above in connection with FIG. 1, may be utilized to remove the photoresist layer 214 and the pad oxide layer 210 from the core device 202 and the I/O device 204 and to remove the pad oxide layer 210 from the high voltage device 206.

As shown in FIG. 2E, a sacrificial oxide layer 218 may be formed or deposited over the substrate 208 of the core device 202, the I/O device 204, and the high voltage device 206 via an in-situ steam generation (ISSG) process. The sacrificial oxide layer 218 may include a material that is used as an isolation material for the substrate 208, such as silicon oxide, iron oxide, aluminum oxide, and/or the like. In some implementations, the sacrificial oxide layer 218 is a sacrificial layer for the core device 202 and the I/O device 204 since the sacrificial oxide layer 218 is removed from the core device 202 and the I/O device 204 in subsequent processing steps. However, the sacrificial oxide layer 218 is not a sacrificial layer for the high voltage device 206 since the sacrificial oxide layer 218 is not removed from the high voltage device 206 in subsequent processing steps and is utilized to create a thicker oxide layer for a gate of the high voltage device 206, as described below. ISSG is an oxidation technology for rapid thermal processing of semiconductor devices, and is a different method of generating steam. ISSG is a low-pressure process (e.g., typically below 20 Torr) where pre-mixed hydrogen and oxygen gasses are introduced to a process chamber directly, without pre-combustion. In some implementations, deposition tool 104 of environment 100, described above in connection with FIG. 1, may be utilized to form or deposit the sacrificial oxide layer 218 over the substrate 208 of the core device 202, the I/O device 204, and the high voltage device 206 via the ISSG process.

As shown in FIG. 2F, a photoresist layer 220 may be formed or deposited on the sacrificial oxide layer 218 of the high voltage device 206. The photoresist layer 220 may include a photoresist material, such as a photopolymeric photoresist (e.g., methyl methacrylate), a photodecomposing photoresist (e.g., diazonaphthaquinone), a photocrosslinking photoresist, and/or the like. In some implementations, the photoresist layer 220 is patterned on the sacrificial oxide layer 218 of the high voltage device 206 to protect the sacrificial oxide layer 218 of the high voltage device 206, as described below. In some implementations, photoresist tool 108 of environment 100, described above in connection with FIG. 1, may be utilized to form or deposit the photoresist layer 220 on the sacrificial oxide layer 218 of the high voltage device 206.

As further shown in FIG. 2F, an ion implantation process may be performed to implant ions (e.g., through the sacrificial oxide layer 218) in the substrates 208 of the core device 202 and the I/O device 204 and to form ion-implanted substrates 208 for the core device 202 and the I/O device 204. The ion-implanted substrates 208 may be formed by implanting ions (e.g., boron, gallium, indium, aluminum, phosphorus, arsenic, antimony, bismuth, and/or the like) in the substrates 208 of the core device 202 and the I/O device 204. In some implementations, deposition tool 104 (e.g., an ion implantation tool) of environment 100, described above in connection with FIG. 1, may be utilized to implant ions in the substrates 208 of the core device 202 and the I/O device 204 and to form the ion-implanted substrates 208 for the core device 202 and the I/O device 204.

As shown in FIG. 2G, the sacrificial oxide layer 218 may be removed from the core device 202 and the I/O device 204. The photoresist layer 220 of the high voltage device 206 may protect the sacrificial oxide layer 218 of the high voltage device 206 from being removed. In some implementations, one or more etching operations may be performed to remove the sacrificial oxide layer 218 from the core device 202 and the I/O device 204. For example, a dry etching operation, utilizing carbon tetrafluoride gas, nitrogen trifluoride gas, chlorine gas, and/or the like, may be performed to remove the sacrificial oxide layer 218 from the core device 202 and the I/O device 204. In some implementations, etch tool 110 of environment 100, described above in connection with FIG. 1, may be utilized to remove the sacrificial oxide layer 218 from the core device 202 and the I/O device 204.

As shown in FIG. 2H, the photoresist layer 220 may be removed from the high voltage device 206. In some implementations, one or more etching operations may be performed to remove the photoresist layer 220 from the high voltage device 206. For example, a dry etching operation, utilizing carbon tetrafluoride gas, nitrogen trifluoride gas, chlorine gas, and/or the like, may be performed to remove the photoresist layer 220 from the high voltage device 206. In some implementations, etch tool 110 of environment 100, described above in connection with FIG. 1, may be utilized to remove the photoresist layer 220 from the high voltage device 206.

As further shown in FIG. 2H, an oxide layer 222 may be formed or deposited over the substrates 208 of the core device 202, the I/O device 204, and the high voltage device 206. The oxide layer 222 may include a material that is used as an isolation material for the substrate 208, such as silicon oxide, iron oxide, aluminum oxide, and/or the like. In some implementations, the oxide layer 222 may combine with the sacrificial oxide layer 218 of the high voltage device 206 to create a thicker oxide layer 224 than the oxide layer 222 of the core device 202 and the I/O device 204. The thicker oxide layer 224 of the high voltage device 206 prevents formation of a divot-induced thinner gate oxide region, and improves drain to gate breakdown voltage for the high voltage device 206 by two or more volts or more than approximately thirty percent (30%) over current manufacturing processes. In some implementations, deposition tool 104 of environment 100, described above in connection with FIG. 1, may be utilized to form or deposit the oxide layer 222 over the substrate 208 of the core device 202, the I/O device 204, and the high voltage device 206.

As shown in FIG. 2I, a photoresist layer 226 may be formed or deposited on the oxide layer 222 of the I/O device 204 and on the oxide layer/sacrificial oxide layer 224 of the high voltage device 206. The photoresist layer 226 may include a photoresist material, such as a photopolymeric photoresist (e.g., methyl methacrylate), a photodecomposing photoresist (e.g., diazonaphthaquinone), a photocrosslinking photoresist, and/or the like. In some implementations, the photoresist layer 226 is patterned on the oxide layer 222 of the I/O device 204 and on the oxide layer/sacrificial oxide layer 224 of the high voltage device 206 to protect the oxide layer 222 of the I/O device 204 and the oxide layer/sacrificial oxide layer 224 of the high voltage device 206, as described below. In some implementations, photoresist tool 108 of environment 100, described above in connection with FIG. 1, may be utilized to form or deposit the photoresist layer 226 on the oxide layer 222 of the I/O device 204 and on the oxide layer/sacrificial oxide layer 224 of the high voltage device 206.

As further shown in FIG. 2I, the oxide layer 222 of the core device 202 may be removed. The photoresist layer 226 of the I/O device 204 and the high voltage device 206 may protect the oxide layer 222 of the I/O device 204 and the oxide layer/sacrificial oxide layer 224 of the high voltage from being removed. In some implementations, one or more etching operations may be performed to remove the oxide layer 222 from the core device 202. For example, a dry etching operation, utilizing carbon tetrafluoride gas, nitrogen trifluoride gas, chlorine gas, and/or the like, may be performed to remove the oxide layer 222 from the core device 202. In some implementations, etch tool 110 of environment 100, described above in connection with FIG. 1, may be utilized to remove the oxide layer 222 from the core device 202.

As shown in FIG. 2J, a thin oxide layer 228 may be formed or deposited over the substrate 208 of the core device 202. The thin oxide layer 228 may include a material that is used as an isolation material for the substrate 208, such as silicon oxide, iron oxide, aluminum oxide, and/or the like. In some implementations, the photoresist layer 226 of the I/O device 204 and the high voltage device 206 may prevent the thin oxide layer 228 (e.g., thinner than the oxide layer of the I/O device 204) from being formed or deposited on the I/O device 204 and the high voltage device 206. In some implementations, deposition tool 104 of environment 100, described above in connection with FIG. 1, may be utilized to form or deposit the thin oxide layer 228 over the substrate 208 of the core device 202.

As further shown in FIG. 2J, the photoresist layer 226 may be removed from the I/O device 204 and the high voltage device 206. In some implementations, one or more etching operations may be performed to remove the photoresist layer 226 from the I/O device 204 and the high voltage device 206. For example, a dry etching operation, utilizing carbon tetrafluoride gas, nitrogen trifluoride gas, chlorine gas, and/or the like, may be performed to remove the photoresist layer 226 from the I/O device 204 and the high voltage device 206. In some implementations, etch tool 110 of environment 100, described above in connection with FIG. 1, may be utilized to remove the photoresist layer 226 from the I/O device 204 and the high voltage device 206.

As further shown in FIG. 2J, the oxide layer/sacrificial oxide layer 224 of the high voltage device 206 may be thicker than the oxide layer 222 of the I/O device 204, and the oxide layer 222 of the I/O device 204 may be thicker than the thin oxide layer 228 of the core device 202. The thicker oxide layer 224 of the high voltage device 206 prevents formation of a divot-induced thinner gate oxide region, and improves drain to gate breakdown voltage for the high voltage device 206 by two or more volts or more than approximately thirty percent (30%) over current manufacturing processes. The thicknesses of the thin oxide layer 228 of the core device 202 and the oxide layer 222 of the I/O device 204 are dependent upon the functionalities of the core device 202 and the I/O device 204. For example, a functionality of the I/O device 204 may require a thicker oxide layer than the thin oxide layer 228 of the core device 202, a functionality of the core device 202 may require a thinner oxide layer, and/or the like.

As shown in FIG. 2K, a gate 230 with spacers 232 may be formed or provided on the thin oxide layer 228 of the core device 202, on the oxide layer of the I/O device 204, and on the oxide layer/sacrificial oxide layer 224 of the high voltage device 206. The gate 230 may include a metal, such as cobalt, tungsten, aluminum, copper, and/or the like. The spacers 232 may include a dielectric material (e.g., polysilicon, silicon nitride, silicon oxide, and/or the like) that electrically isolates the gate 230 from other components of the semiconductor device. In some implementations, deposition tool 104 of environment 100, described above in connection with FIG. 1, may be utilized to deposit a metal layer on the thin oxide layer 228 of the core device 202, on the oxide layer of the I/O device 204, and on the oxide layer/sacrificial oxide layer 224 of the high voltage device 206. Photoresist tool 108 of environment 100, described above in connection with FIG. 1, may be utilized to pattern a photoresist layer on the metal layer. Etch tool 110 of environment 100, described above in connection with FIG. 1, may be utilized to etch the metal layer (e.g., except the metal layers provided below the photoresist layer) and to define the gates 230 for the core device 202, the I/O device 204, and the high voltage device 206. Etch tool 110 may be utilized to remove the photoresist layer from the gates 230 for the core device 202, the I/O device 204, and the high voltage device 206. Deposition tool 104 of environment 100, described above in connection with FIG. 1, may be utilized to deposit a dielectric layer on and around the gates 230 of the core device 202, the I/O device 204, and the high voltage device 206. Etch tool 110 may then be utilized to remove portions of the dielectric layer and to define the spacers 232 for the gates 230 of the core device 202, the I/O device 204, and the high voltage device 206.

As shown in FIG. 2L, an ion implantation process may be performed to form source regions 234 and drain regions 236 in the substrates 208 of the core device 202, the I/O device 204, and the high voltage device 206. As shown, the source regions 234 and the drain regions 236 may be formed on opposite sides of the gates 230 of the core device 202, the I/O device 204, and the high voltage device 206. In some implementations, deposition tool 104 (e.g., an ion implantation tool) of environment 100, described above in connection with FIG. 1, may be utilized to implant ions in the substrates 208 of the core device 202, the I/O device 204, and the high voltage device 206 and to form doped polysilicon regions in the substrates 208 of the core device 202, the I/O device 204, and the high voltage device 206. Annealing tool 106 of environment 100, described above in connection with FIG. 1, may be utilized to perform a rapid thermal annealing that activates the ion dopants of the doped polysilicon regions formed in the substrates 208 of the core device 202, the I/O device 204, and the high voltage device 206. The activated doped polysilicon regions may form the source regions 234 and the drain regions 236 in the substrates 208 of the core device 202, the I/O device 204, and the high voltage device 206.

As shown in FIG. 2M, a protective oxide layer 238 may be formed on a portion of the gate 230 and a portion of the drain region 236 of the high voltage device 206. The protective oxide layer 238 may also be formed on one of the spacers 232 and a portion of the n-type drift region 217 of the substrate 208. In some implementations, the protective oxide layer 238 may be formed so as not to cover any portion of the gate 230 and/or any portion of the drain region 236 of the high voltage device 206. In some implementations, in addition to or instead of the protective oxide layer 238 described above, a protective oxide layer may be formed or deposited on a portion of the gate 230 and a portion of the source region 234 of the high voltage device 206. In some implementations, the protective oxide layer 238 covers a portion of the third portion of the substrate 208 and covers an entire surface of a spacer in the set of spacers 232.

The protective oxide layer 238 may include a material that is used as an isolation material for the portion of the gate 230 and the portion of the drain region 236 of the high voltage device 206, such as silicon oxide, iron oxide, aluminum oxide, and/or the like. In some implementations, deposition tool 104 of environment 100, described above in connection with FIG. 1, may be utilized to form or deposit the protective oxide layer 238 on the portion of the gate 230 and the portion of the drain region 236 of the high voltage device 206.

As shown in FIG. 2N, silicide layers 240 may be formed or deposited over portions of the gates 230, the source regions 234, and the drain regions 236 of the core device 202, the I/O device 204, and the high voltage device 206. As further shown, the protective oxide layer 238 may prevent the silicide layers 240 from forming or being deposited on a portion of the gate 230 and a portion of the drain region 236 of the high voltage device 206. In some implementations, deposition tool 104 of environment 100, described above in connection with FIG. 1, may be utilized to form or deposit oxide layers on the portions of the gates 230, the source regions 234, and the drain regions 236 of the core device 202, the I/O device 204, and the high voltage device 206 that define the silicide layers 240. Deposition tool 104 may also be utilized to form or deposit metal layers on the oxide layers formed or deposited on the portions of the gates 230, the source regions 234, and the drain regions 236 of the core device 202, the I/O device 204, and the high voltage device 206. Annealing tool 106 of environment 100, described above in connection with FIG. 1, may be utilized to perform a rapid thermal annealing that interacts with the metal layers to form or deposit the silicide layers 240 over the portions of the gates 230, the source regions 234, and the drain regions 236 of the core device 202, the I/O device 204, and the high voltage device 206.

As shown in FIG. 2O, the current process described herein (e.g., where the oxide layer is thicker) improves a drain to gate breakdown voltage by more than thirty percent relative to former processes. For example, the current process described herein improves drain to gate breakdown voltage of high voltage device 206 by more than two volts or more than approximately thirty percent (30%) over current manufacturing processes.

As indicated above, FIGS. 2A-2O are provided merely as one or more examples. Other examples may differ from what is described with regard to FIGS. 2A-2O.

Figure 3:
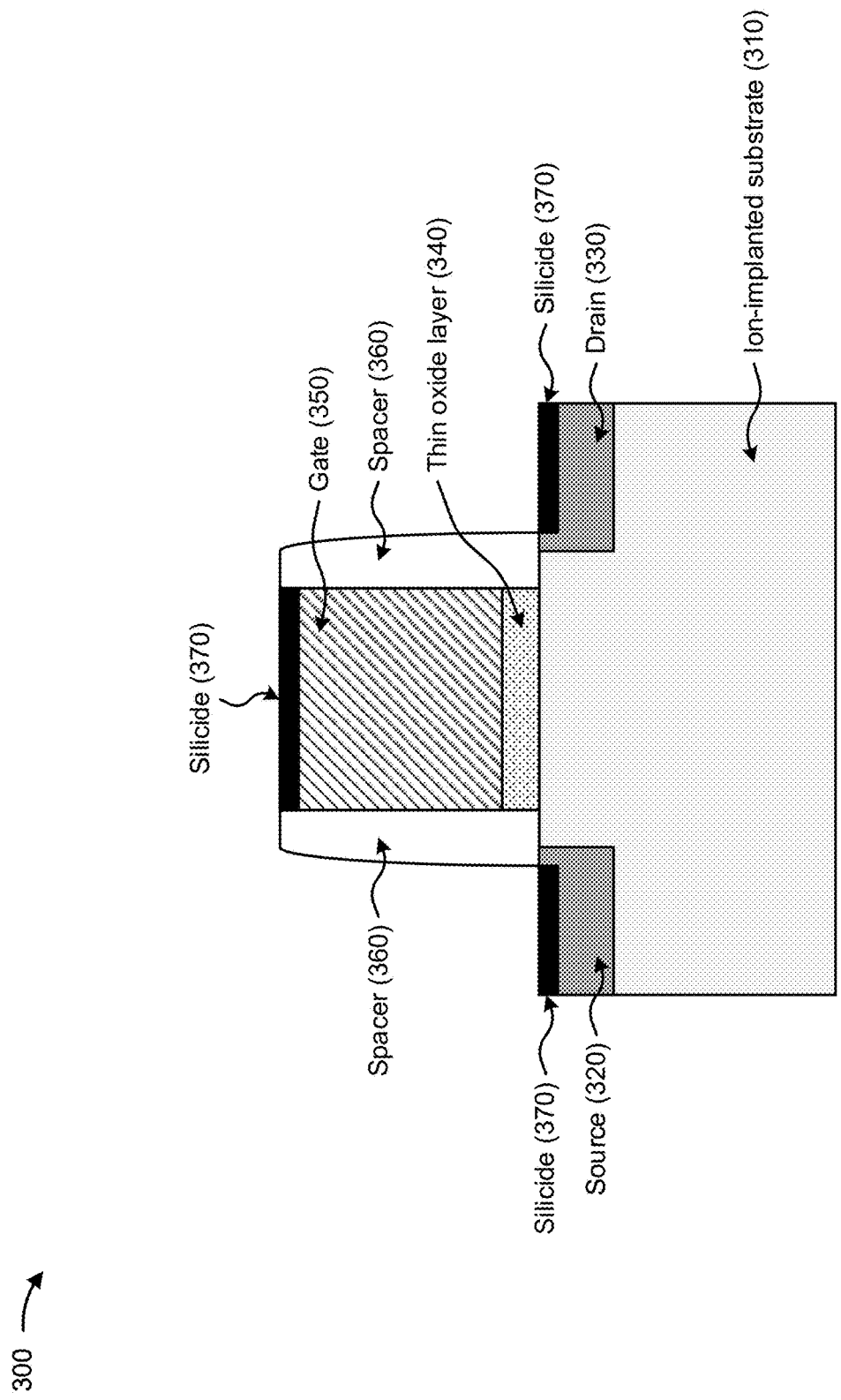
FIG. 3 is a diagram of an example core device described herein.

FIG. 3 is a diagram of an example core device 300 described herein. As shown, core device 300 may include an ion-implanted substrate 310, as described above in connection with FIG. 2F. Ion-implanted substrate 310 may include a source region 320 and a drain region 330, as described above in connection with FIG. 2L. A thin oxide layer 340 may be formed or deposited on a surface of ion-implanted substrate 310 and in between source region 320 and drain region 330, as described above in connection with FIG. 2J. A gate 350 may be formed or deposited on thin oxide layer 340, as described above in connection with FIG. 2K. Spacers 360 may be formed or deposited on sides of thin oxide layer 340 and gate 350, as described above in connection with FIG. 2K. Silicide layers 370 may be formed or deposited on gate 350 and on portions of source region 320 and drain region 330, as described above in connection with FIG. 2N.

As indicated above, FIG. 3 is provided merely as an example. Other examples may differ from what is described with regard to FIG. 3.

Figure 4:
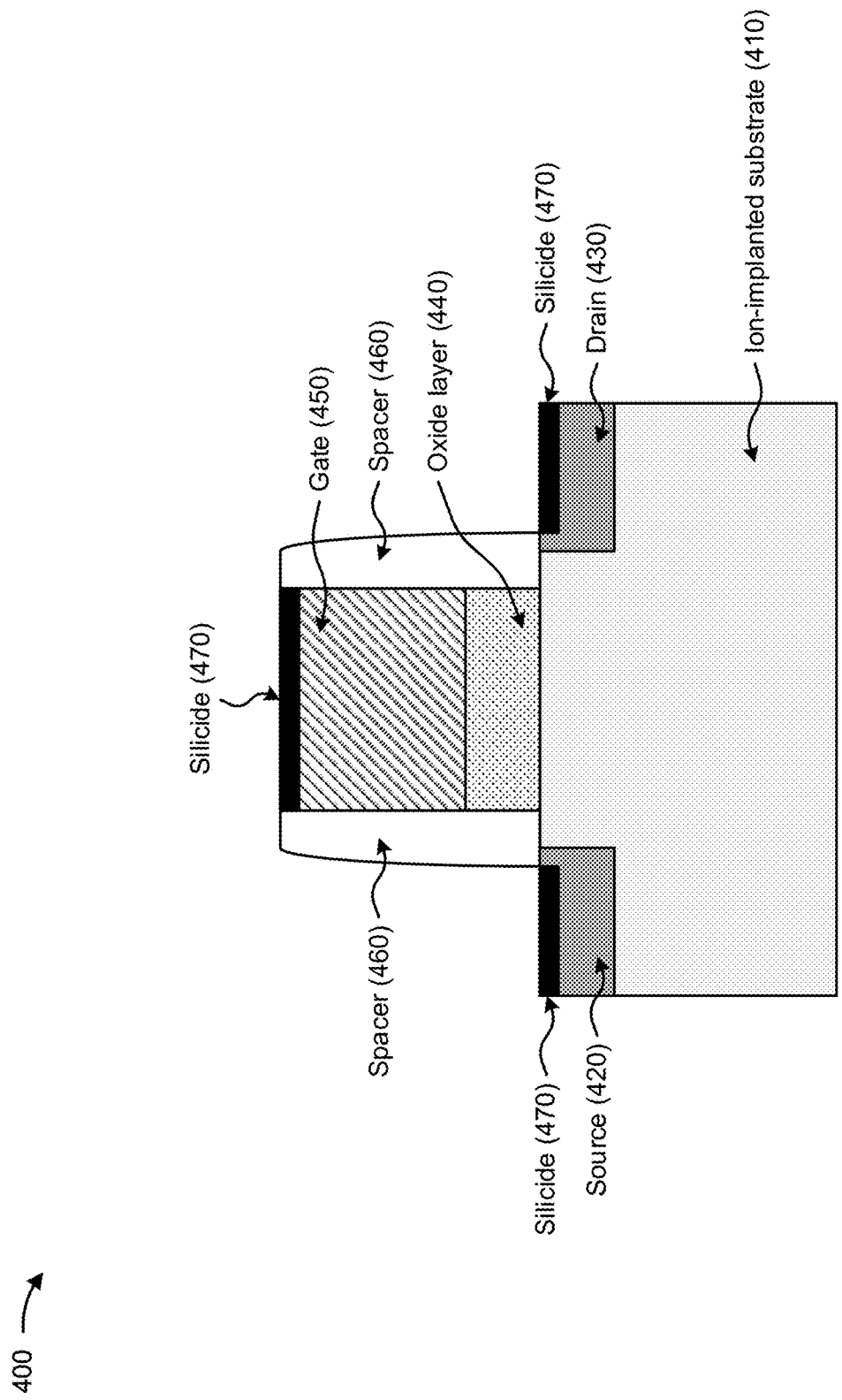
FIG. 4 is a diagram of an example input/output (I/O) device described herein.

FIG. 4 is a diagram of an example I/O device 400 described herein. As shown, I/O device 400 may include an ion-implanted substrate 410, as described above in connection with FIG. 2F. Ion-implanted substrate 410 may include a source region 420 and a drain region 430, as described above in connection with FIG. 2L. An oxide layer 440 may be formed or deposited on a surface of ion-implanted substrate 410 and in between source region 420 and drain region 430, as described above in connection with FIG. 2H. A gate 450 may be formed or provided on oxide layer 440, as described above in connection with FIG. 2K. Spacers 460 may be formed on sides of oxide layer 440 and gate 450, as described above in connection with FIG. 2K. Silicide layers 470 may be formed or deposited on gate 450 and on portions of source region 420 and drain region 430, as described above in connection with FIG. 2N.

As indicated above, FIG. 4 is provided merely as an example. Other examples may differ from what is described with regard to FIG. 4.

Figure 5:
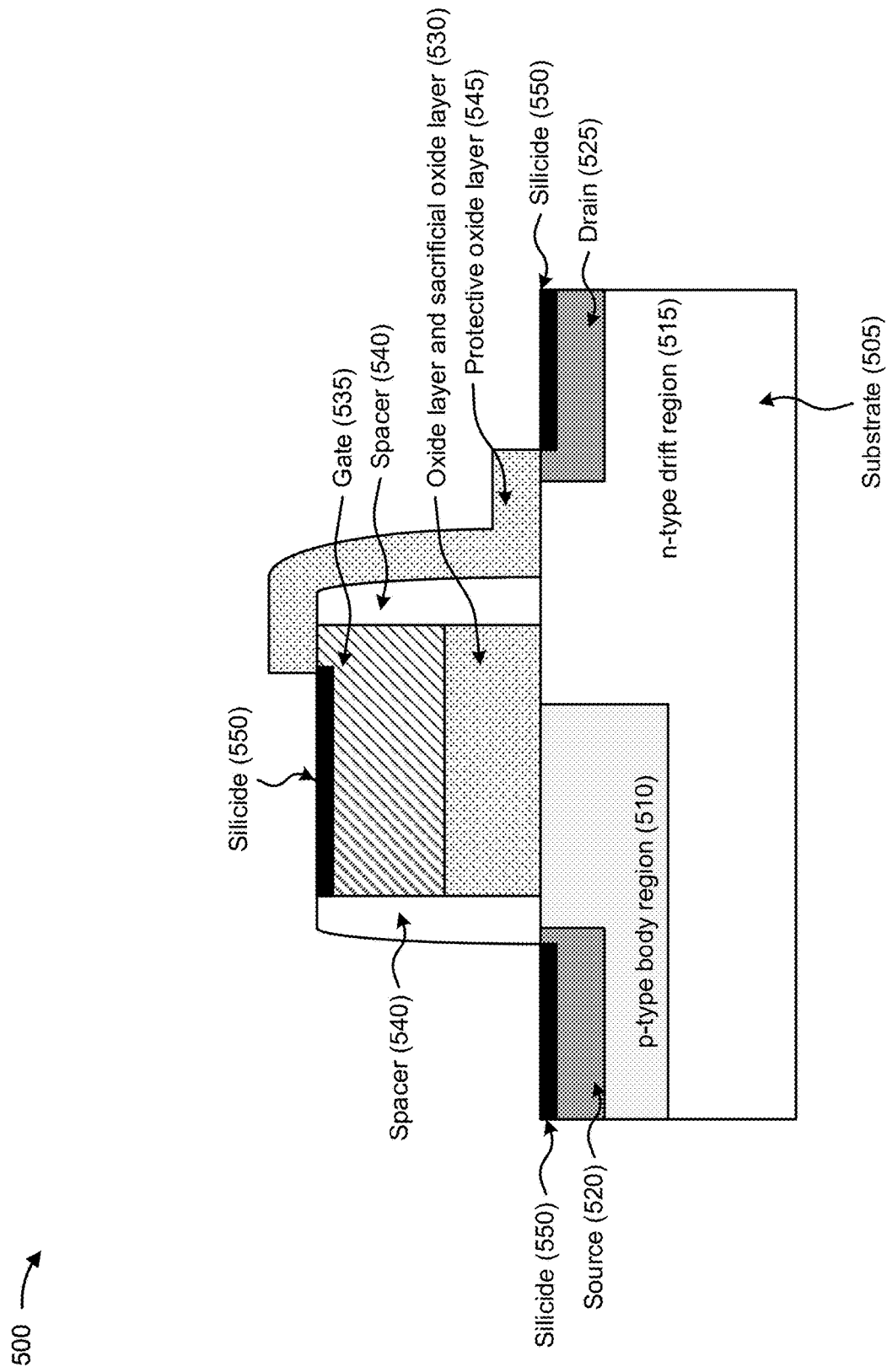
FIG. 5 is a diagram of an example high voltage device described herein.

FIG. 5 is a diagram of an example high voltage device 500 described herein. As shown, high voltage device 500 may include a substrate 505, as described above in connection with FIG. 2A. Substrate 505 may include a p-type body region 510 and an n-type drift region 515, as described above in connection with FIG. 2C. P-type body region 510 may include a source region 520 and n-type drift region 515 may include a drain region 525, as described above in connection with FIG. 2L. An oxide layer and sacrificial oxide layer 530 may be formed or deposited on a surface of substrate 505 and in between source region 520 and drain region 525, as described above in connection with FIG. 2H. A gate 535 may be formed or provided on oxide layer and sacrificial oxide layer 530, as described above in connection with FIG. 2K. Spacers 540 may be formed or provided on sides of oxide layer and sacrificial oxide layer 530 and gate 535, as described above in connection with FIG. 2K. A protective oxide layer 545 may be formed or deposited on a portion of gate 535, one of spacers 540, a portion of n-type drift region 515, and a portion of drain region 525, as described above in connection with FIG. 2M. Silicide layers 550 may be formed or deposited on portions of gate 535, source region 520, and drain region 525, other than portions provided under protective oxide layer 545, as described above in connection with FIG. 2N.

As indicated above, FIG. 5 is provided merely as an example. Other examples may differ from what is described with regard to FIG. 5.

Figure 6:
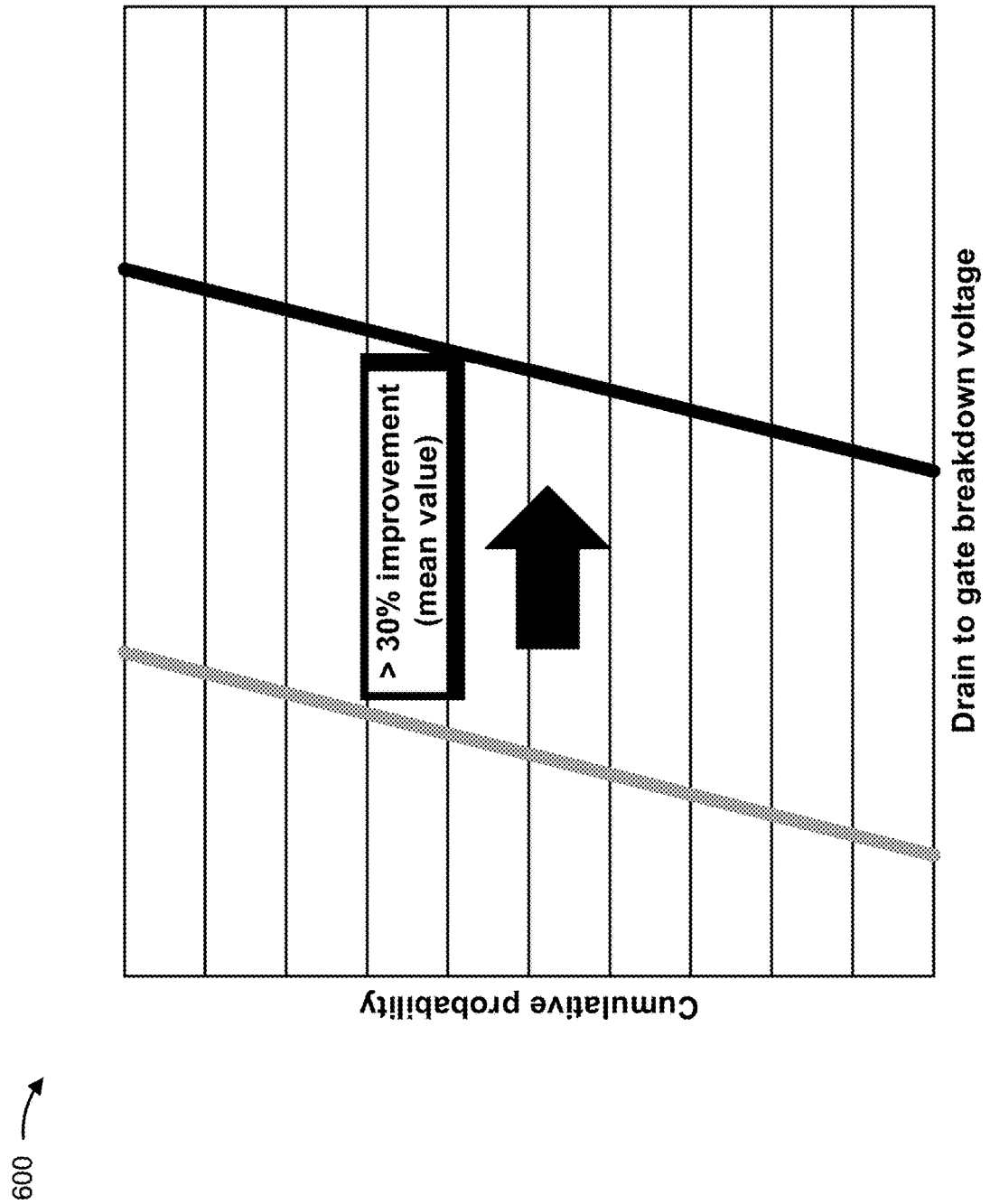
FIG. 6 is a graph showing an example improvement in drain to gate breakdown voltage for the example semiconductor devices described herein.

FIG. 6 is a graph 600 showing an example improvement in drain to gate breakdown voltage for the example semiconductor devices described herein. As shown, the mask-free method described herein improves drain to gate breakdown voltage in the example semiconductor device (e.g., in high voltage device 500 of the example semiconductor device). For example, the method improves drain to gate breakdown voltage by two or more volts or by more than approximately thirty percent (30%) over current manufacturing processes. Thus, the semiconductor device may be utilized for high voltage operation (e.g., as a power semiconductor device).

As indicated above, FIG. 6 is provided merely as an example. Other examples may differ from what is described with regard to FIG. 6.

Figure 7:
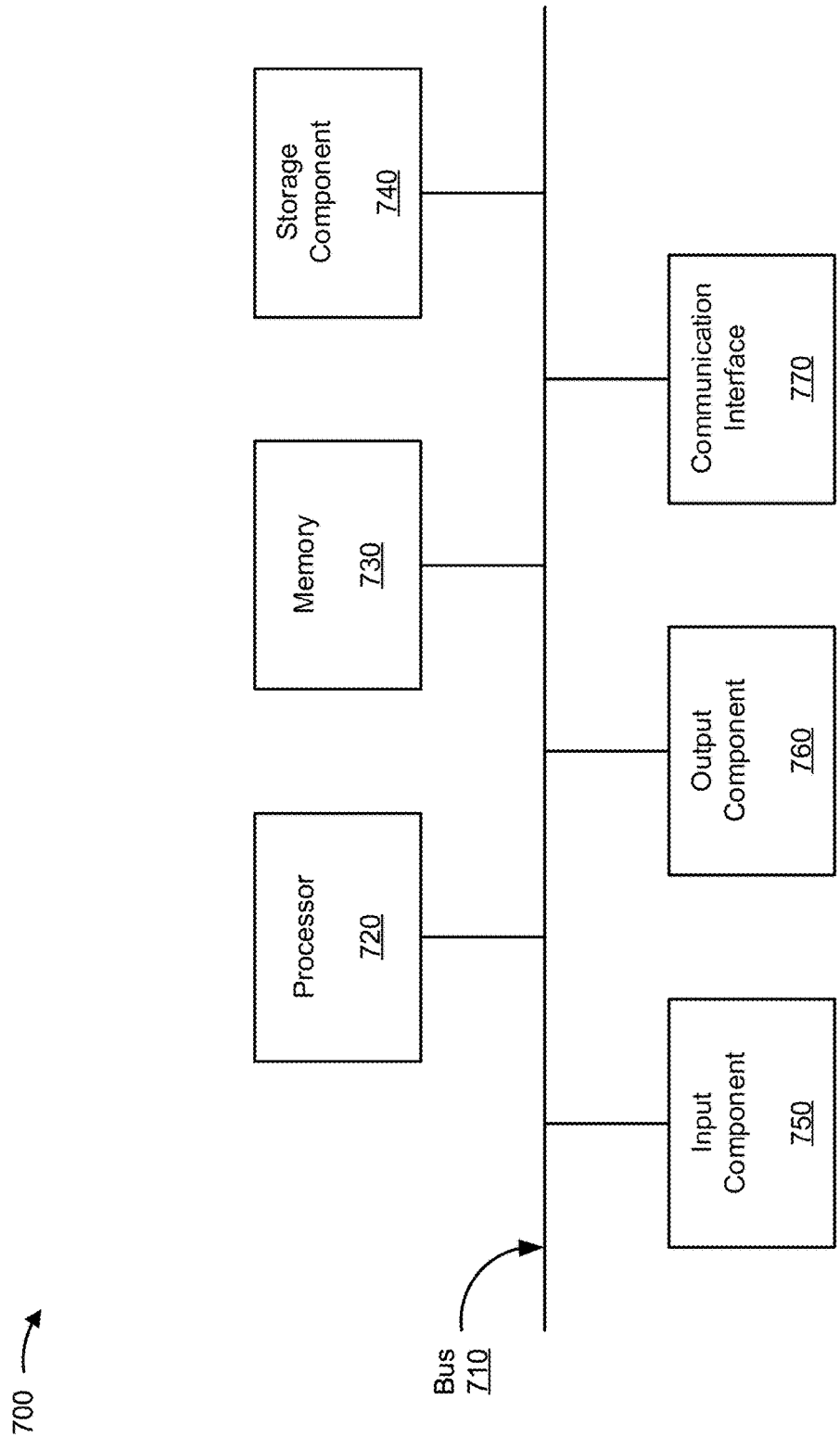
FIG. 7 is a diagram of example components of one or more tools and/or devices of FIG. 1.

FIG. 7 is a diagram of example components of a device 700. Device 700 may correspond to pre-clean tool 102, deposition tool 104, annealing tool 106, photoresist tool 108, etch tool 110, and/or wafer/die transport device 112. In some implementations, pre-clean tool 102, deposition tool 104, annealing tool 106, photoresist tool 108, etch tool 110, and/or wafer/die transport device 112 may include one or more devices 700 and/or one or more components of device 700. As shown in FIG. 7, device 700 may include a bus 710, a processor 720, a memory 730, a storage component 740, an input component 750, an output component 760, and a communication interface 770.

Bus 710 includes a component that permits communication among the components of device 700. Processor 720 is implemented in hardware, firmware, or a combination of hardware and software. Processor 720 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 720 includes one or more processors capable of being programmed to perform a function. Memory 730 includes a random access memory (RAM), a read only memory (ROM), and/or another type of dynamic or static storage device (e.g., a flash memory, a magnetic memory, and/or an optical memory) that stores information and/or instructions for use by processor 720.

Storage component 740 stores information and/or software related to the operation and use of device 700. For example, storage component 740 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 750 includes a component that permits device 700 to receive information, such as via user input (e.g., a touch screen display, a keyboard, a keypad, a mouse, a button, a switch, and/or a microphone). Additionally, or alternatively, input component 750 may include a sensor for sensing information (e.g., a global positioning system (GPS) component, an accelerometer, a gyroscope, and/or an actuator). Output component 760 includes a component that provides output information from device 700 (e.g., a display, a speaker, and/or one or more LEDs).

Communication interface 770 includes a transceiver-like component (e.g., a transceiver and/or a separate receiver and transmitter) that enables device 700 to communicate with other devices, such as via a wired connection, a wireless connection, or a combination of wired and wireless connections. Communication interface 770 may permit device 700 to receive information from another device and/or provide information to another device. For example, communication interface 770 may include an Ethernet interface, an optical interface, a coaxial interface, an infrared interface, an RF interface, a universal serial bus (USB) interface, a wireless local area interface, a cellular network interface, and/or the like.

Device 700 may perform one or more processes described herein. Device 700 may perform these processes based on processor 720 executing software instructions stored by a non-transitory computer-readable medium, such as memory 730 and/or storage component 740. A computer-readable medium is defined herein as a non-transitory memory device. A memory device includes memory space within a single physical storage device or memory space spread across multiple physical storage devices.

Software instructions may be read into memory 730 and/or storage component 740 from another computer-readable medium or from another device via communication interface 770. When executed, software instructions stored in memory 730 and/or storage component 740 may cause processor 720 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 700 may include additional components, fewer components, different components, or differently arranged components than those shown in FIG. 5. Additionally, or alternatively, a set of components (e.g., one or more components) of device 700 may perform one or more functions described as being performed by another set of components of device 700.

Figure 8:
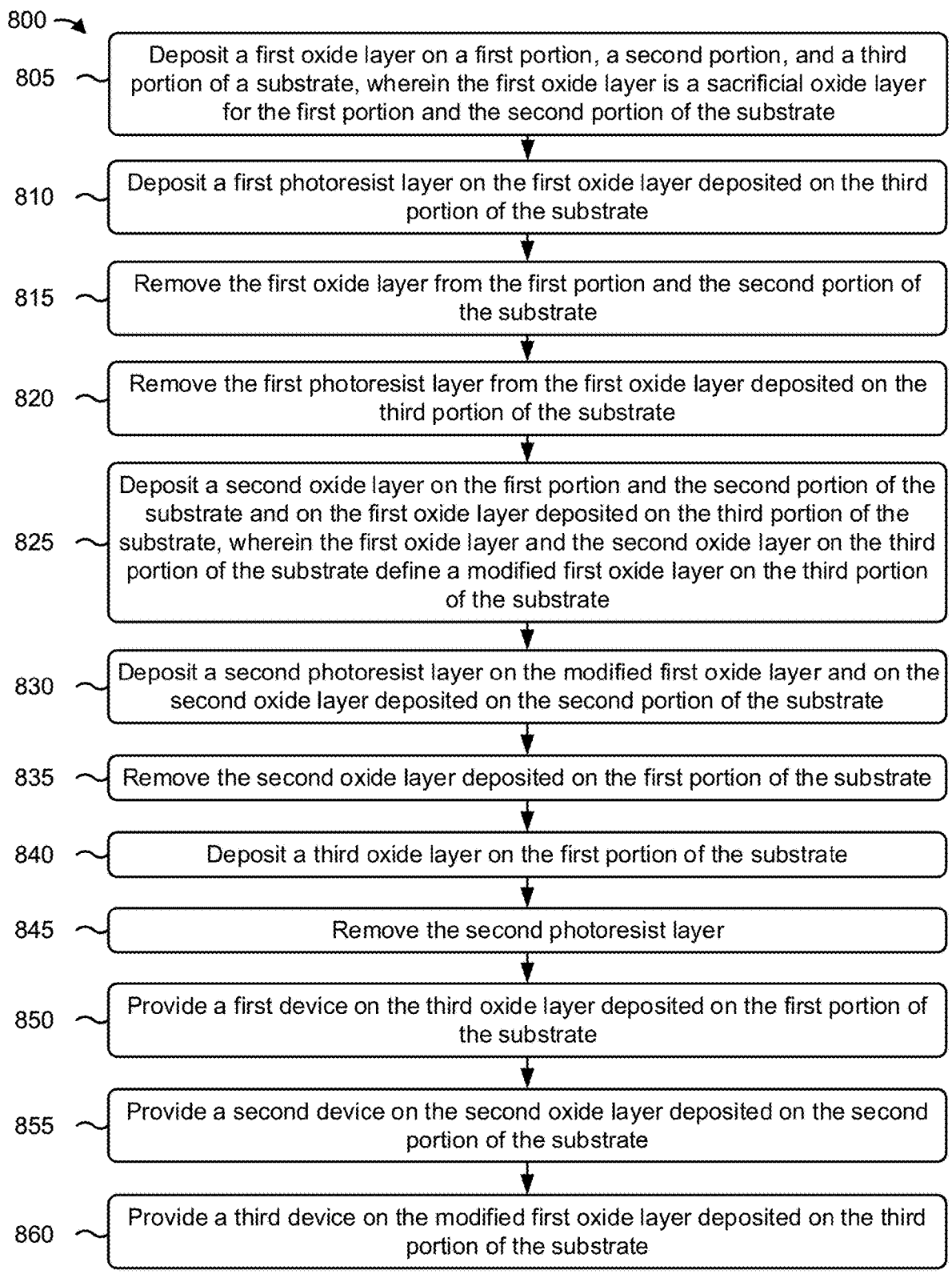
FIGS. 8 and 9 are flowcharts of example mask-free processes for improving drain to gate breakdown voltage in semiconductor devices.

FIG. 8 is a flowchart of an example process 800 associated with a mask-free process for improving drain to gate breakdown voltage in semiconductor devices. In some implementations, one or more process blocks of FIG. 8 may be performed by a device (e.g., one or more of the semiconductor processing tools described above in connection with FIG. 1). Additionally, or alternatively, one or more process blocks of FIG. 8 may be performed by one or more components of device 700, such as processor 720, memory 730, storage component 740, input component 750, output component 760, and/or communication interface 770.

As shown in FIG. 8, process 800 may include depositing a first oxide layer on a first portion, a second portion, and a third portion of a substrate, where the first oxide layer is a sacrificial oxide layer for the first portion and the second portion of the substrate (block 805). For example, the device may deposit a first oxide layer on a first portion, a second portion, and a third portion of a substrate, where the first oxide layer is a sacrificial oxide layer for the first portion and the second portion of the substrate, as described above.

As further shown in FIG. 8, process 800 may include depositing a first photoresist layer on the first oxide layer deposited on the third portion of the substrate (block 810).

For example, the device may deposit a first photoresist layer on the first oxide layer deposited on the third portion of the substrate, as described above.

As further shown in FIG. 8, process 800 may include removing the first oxide layer from the first portion and the second portion of the substrate (block 815). For example, the device may remove the first oxide layer from the first portion and the second portion of the substrate, as described above.

As further shown in FIG. 8, process 800 may include removing the first photoresist layer from the first oxide layer deposited on the third portion of the substrate (block 820). For example, the device may remove the first photoresist layer from the first oxide layer deposited on the third portion of the substrate, as described above.

As further shown in FIG. 8, process 800 may include depositing a second oxide layer on the first portion and the second portion of the substrate and on the first oxide layer deposited on the third portion of the substrate, where the first oxide layer and the second oxide layer on the third portion of the substrate define a modified first oxide layer on the third portion of the substrate (block 825). For example, the device may deposit a second oxide layer on the first portion and the second portion of the substrate and on the first oxide layer deposited on the third portion of the substrate, where the first oxide layer and the second oxide layer on the third portion of the substrate define a modified first oxide layer on the third portion of the substrate, as described above.

As further shown in FIG. 8, process 800 may include depositing a second photoresist layer on the modified first oxide layer and on the second oxide layer deposited on the second portion of the substrate (block 830). For example, the device may deposit a second photoresist layer on the modified first oxide layer and on the second oxide layer deposited on the second portion of the substrate, as described above.

As further shown in FIG. 8, process 800 may include removing the second oxide layer deposited on the first portion of the substrate (block 835). For example, the device may remove the second oxide layer deposited on the first portion of the substrate, as described above.

As further shown in FIG. 8, process 800 may include depositing a third oxide layer on the first portion of the substrate (block 840). For example, the device may deposit a third oxide layer on the first portion of the substrate, as described above.

As further shown in FIG. 8, process 800 may include removing the second photoresist layer (block 845). For example, the device may remove the second photoresist layer, as described above.

As further shown in FIG. 8, process 800 may include providing a first device on the third oxide layer deposited on the first portion of the substrate (block 850). For example, the device may provide a first device on the third oxide layer deposited on the first portion of the substrate, as described above.

As further shown in FIG. 8, process 800 may include providing a second device on the second oxide layer deposited on the second portion of the substrate (block 855). For example, the device may provide a second device on the second oxide layer deposited on the second portion of the substrate, as described above.

As further shown in FIG. 8, process 800 may include providing a third device on the modified first oxide layer deposited on the third portion of the substrate (block 860). For example, the device may provide a third device on the modified first oxide layer deposited on the third portion of the substrate, as described above.

Process 800 may include additional implementations, such as any single implementation or any combination of implementations described below and/or in connection with one or more other processes described elsewhere herein.

In a first implementation, process 800 includes implanting ions in the first portion and the second portion of the substrate to form ion-implanted portions of the substrate. In a second implementation, alone or in combination with the first implementation, the third device is a high voltage device. In a third implementation, alone or in combination with one or more of the first and second implementations, the modified first oxide layer is an in-situ steam generation oxide layer. In a fourth implementation, alone or in combination with one or more of the first through third implementations, providing a third device on the modified first oxide layer deposited on the third portion of the substrate includes forming a gate with spacers on the modified first oxide layer, implanting ions to form a source region and a drain region in the third portion of the substrate and on opposite sides of the gate, depositing a protective oxide layer on a portion of the gate and a portion of the drain region, and depositing silicide layers over portions of the gate, the source region, and the drain region except for the portion of the gate and the portion of the drain region covered by the protective oxide layer.

In a fifth implementation, alone or in combination with one or more of the first through fourth implementations, process 800 includes the first device is a core device, the second device is an input/output device, and the third device is a high voltage device. In a sixth implementation, alone or in combination with one or more of the first through fifth implementations, a thickness of the modified first oxide layer is greater than a thickness of the second oxide layer, and the thickness of the second oxide layer is greater than a thickness of the third oxide layer.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Figure 9:
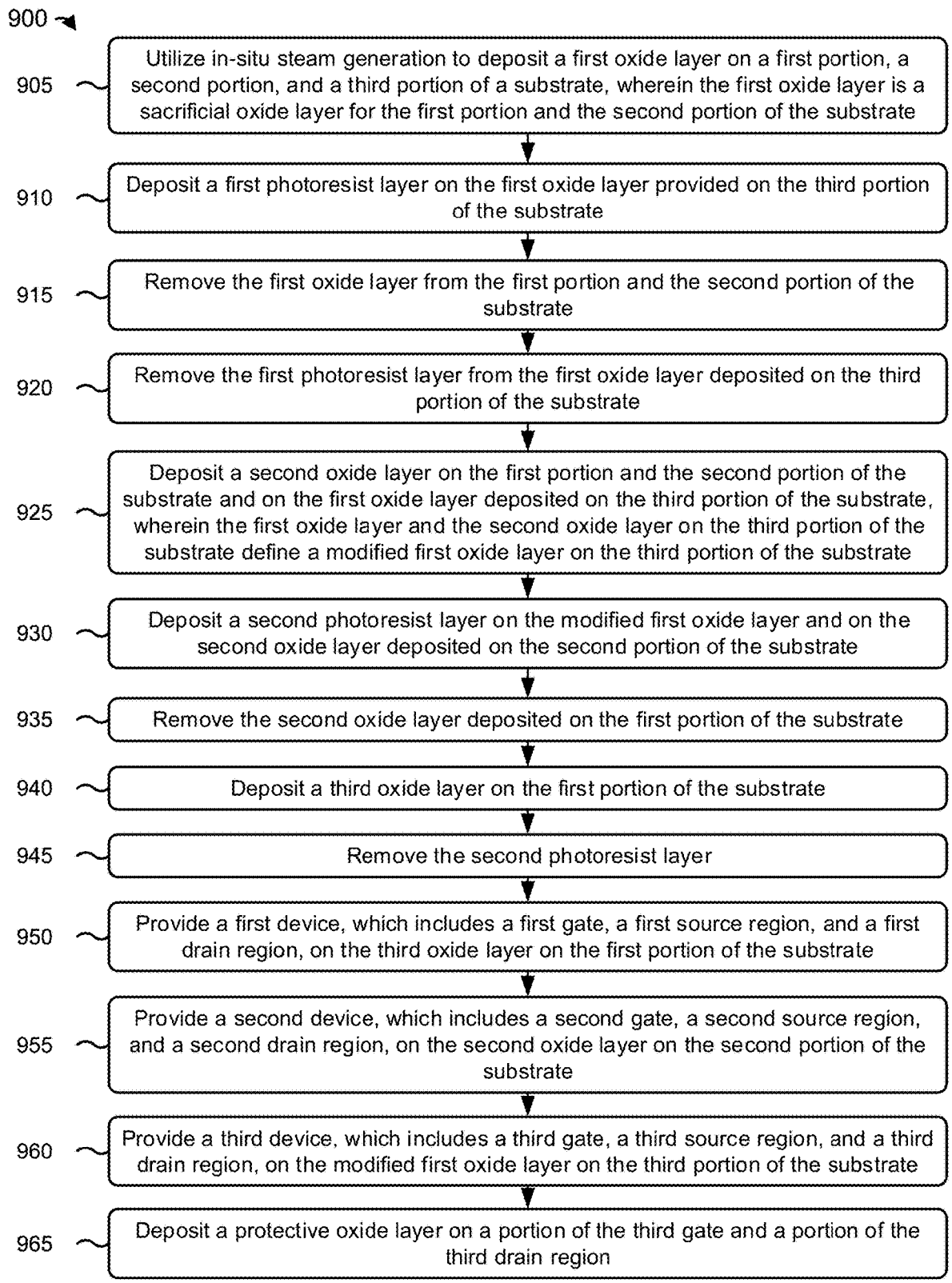

FIG. 9 is a flowchart of an example process 900 associated with a mask-free process for improving drain to gate breakdown voltage in semiconductor devices. In some implementations, one or more process blocks of FIG. 9 may be performed by a device (e.g., one or more of the semiconductor processing tools described above in connection with FIG. 1). Additionally, or alternatively, one or more process blocks of FIG. 9 may be performed by one or more components of device 700, such as processor 720, memory 730, storage component 740, input component 750, output component 760, and/or communication component 770.

As shown in FIG. 9, process 900 may include utilizing in-situ steam generation to deposit a first oxide layer on a first portion, a second portion, and a third portion of a substrate, where the first oxide layer is a sacrificial oxide layer for the first portion and the second portion of the substrate (block 905). For example, the device may utilize in-situ steam generation to deposit a first oxide layer on a first portion, a second portion, and a third portion of a substrate, where the first oxide layer is a sacrificial oxide layer for the first portion and the second portion of the substrate, as described above.

As further shown in FIG. 9, process 900 may include depositing a first photoresist layer on the first oxide layer provided on the third portion of the substrate (block 910). For example, the device may deposit a first photoresist layer on the first oxide layer provided on the third portion of the substrate, as described above.

As further shown in FIG. 9, process 900 may include removing the first oxide layer from the first portion and the second portion of the substrate (block 915). For example, the device may remove the first oxide layer from the first portion and the second portion of the substrate, as described above.

As further shown in FIG. 9, process 900 may include removing the first photoresist layer from the first oxide layer deposited on the third portion of the substrate (block 920). For example, the device may remove the first photoresist layer from the first oxide layer deposited on the third portion of the substrate, as described above.

As further shown in FIG. 9, process 900 may include depositing a second oxide layer on the first portion and the second portion of the substrate and on the first oxide layer deposited on the third portion of the substrate, where the first oxide layer and the second oxide layer on the third portion of the substrate define a modified first oxide layer on the third portion of the substrate (block 925). For example, the device may deposit a second oxide layer on the first portion and the second portion of the substrate and on the first oxide layer deposited on the third portion of the substrate, where the first oxide layer and the second oxide layer on the third portion of the substrate define a modified first oxide layer on the third portion of the substrate, as described above.

As further shown in FIG. 9, process 900 may include depositing a second photoresist layer on the modified first oxide layer and on the second oxide layer deposited on the second portion of the substrate (block 930). For example, the device may deposit a second photoresist layer on the modified first oxide layer and on the second oxide layer deposited on the second portion of the substrate, as described above.

As further shown in FIG. 9, process 900 may include removing the second oxide layer deposited on the first portion of the substrate (block 935). For example, the device may remove the second oxide layer deposited on the first portion of the substrate, as described above.

As further shown in FIG. 9, process 900 may include depositing a third oxide layer on the first portion of the substrate (block 940). For example, the device may deposit a third oxide layer on the first portion of the substrate, as described above.

As further shown in FIG. 9, process 900 may include removing the second photoresist layer (block 945). For example, the device may remove the second photoresist layer, as described above.

As further shown in FIG. 9, process 900 may include providing a first device, which includes a first gate, a first source region, and a first drain region, on the third oxide layer on the first portion of the substrate (block 950). For example, the device may provide a first device, which includes a first gate, a first source region, and a first drain region, on the third oxide layer on the first portion of the substrate, as described above.

As further shown in FIG. 9, process 900 may include providing a second device, which includes a second gate, a second source region, and a second drain region, on the second oxide layer on the second portion of the substrate (block 955). For example, the device may provide a second device, which includes a second gate, a second source region, and a second drain region, on the second oxide layer on the second portion of the substrate, as described above.

As further shown in FIG. 9, process 900 may include providing a third device, which includes a third gate, a third source region, and a third drain region, on the modified first oxide layer on the third portion of the substrate (block 960).

For example, the device may provide a third device, which includes a third gate, a third source region, and a third drain region, on the modified first oxide layer on the third portion of the substrate, as described above.

As further shown in FIG. 9, process 900 may include depositing a protective oxide layer on a portion of the third gate and a portion of the third drain region (block 965). For example, the device may deposit a protective oxide layer on a portion of the third gate and a portion of the third drain region, as described above.

Process 900 may include additional implementations, such as any single implementation or any combination of implementations described below and/or in connection with one or more other processes described elsewhere herein.

In a first implementation, process 900 includes the first gate, the first source region, and the first drain region define a core device for the semiconductor device, the second gate, the second source region, and the second drain region define an input/output device for the semiconductor device, and the third gate, the third source region, and the third drain region define a high voltage device for the semiconductor device. In a second implementation, alone or in combination with the first implementation, process 900 includes depositing silicide layers over portions of the first gate, the second gate, the third gate, the first source region, the second source region, the third source region, the first drain region, the second drain region, and the third drain region.

In a third implementation, alone or in combination with one or more of the first and second implementations, process 900 includes depositing silicide layers over portions of the third gate, the third source region, and the third drain region except for the portion of the third gate and the portion of the third drain region covered by the protective oxide layer. In a fourth implementation, alone or in combination with one or more of the first through third implementations, a thickness of the modified first oxide layer is greater than a thickness of the second oxide layer, and the thickness of the second oxide layer is greater than a thickness of the third oxide layer. In a fifth implementation, alone or in combination with one or more of the first through fourth implementations, the third device is a high voltage device.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a method for manufacturing a semiconductor device is based on a mask-free process that improves drain to gate breakdown voltage in high voltage device 500 of the semiconductor device. The method may include utilization of a sacrificial oxide for a gate oxide region of high voltage device 500, which increases a thickness of the gate oxide region and prevents formation of the divot-induced thinner gate oxide region. The method improves drain to gate breakdown voltage of high voltage device 500 by more than two volts or more than approximately thirty percent (30%) over current manufacturing processes. Thus, the semiconductor device may be utilized for high voltage operation (e.g., as a power semiconductor device). Furthermore, the method may be utilized to simultaneously manufacture core device 300, I/O device 400, and high voltage device 500, without affecting performances of such devices.

As described in greater detail above, some implementations described herein provide a method for manufacturing a semiconductor device. The method includes depositing a first oxide layer on a first portion, a second portion, and a third portion of a substrate, where the first oxide layer is a sacrificial oxide layer for the first portion and the second portion of the substrate. The method includes depositing a first photoresist layer on the first oxide layer deposited on the third portion of the substrate. The method includes removing the first oxide layer from the first portion and the second portion of the substrate. The method includes removing the first photoresist layer from the first oxide layer deposited on the third portion of the substrate. The method includes depositing a second oxide layer on the first portion and the second portion of the substrate and on the first oxide layer deposited on the third portion of the substrate, where the first oxide layer and the second oxide layer on the third portion of the substrate define a modified first oxide layer on the third portion of the substrate. The method includes depositing a second photoresist layer on the modified first oxide layer and on the second oxide layer deposited on the second portion of the substrate. The method includes removing the second oxide layer deposited on the first portion of the substrate. The method includes depositing a third oxide layer on the first portion of the substrate. The method includes removing the second photoresist layer. The method includes providing a first device on the third oxide layer deposited on the first portion of the substrate. The method includes providing a second device on the second oxide layer deposited on the second portion of the substrate. The method includes providing a third device on the modified first oxide layer deposited on the third portion of the substrate.

As described in greater detail above, some implementations described herein provide a semiconductor device. The semiconductor device includes a substrate that includes a first portion, a second portion, and a third portion. The semiconductor device includes a first device on the first portion of the substrate. The semiconductor device includes a second device on the second portion of the substrate. The semiconductor device includes a third device on the third portion of the substrate and including, an oxide layer on the third portion, where a thickness of the oxide layer is greater than thicknesses of oxide layers utilized for the first device and the second device, a gate on the oxide layer, a set of spacers on opposite sides of the gate, a source region in the third portion of the substrate on one side of the gate, a drain region in the third portion of the substrate on another side of the gate, and a protective oxide layer on a portion of the gate and a portion of the drain region.

As described in greater detail above, some implementations described herein provide a method for manufacturing a semiconductor device. The method includes utilizing in-situ steam generation to deposit a first oxide layer on a first portion, a second portion, and a third portion of a substrate, where the first oxide layer is a sacrificial oxide layer for the first portion and the second portion of the substrate. The method includes depositing a first photoresist layer on the first oxide layer provided on the third portion of the substrate. The method includes removing the first oxide layer from the first portion and the second portion of the substrate. The method includes removing the first photoresist layer from the first oxide layer deposited on the third portion of the substrate. The method includes depositing a second oxide layer on the first portion and the second portion of the substrate and on the first oxide layer deposited on the third portion of the substrate, where the first oxide layer and the second oxide layer on the third portion of the substrate define a modified first oxide layer on the third portion of the substrate. The method includes depositing a second photoresist layer on the modified first oxide layer and on the second oxide layer deposited on the second portion of the substrate. The method includes removing the second oxide layer deposited on the first portion of the substrate. The method includes depositing a third oxide layer on the first portion of the substrate. The method includes removing the second photoresist layer. The method includes providing a first device, which includes a first gate, a first source region, and a first drain region, on the third oxide layer on the first portion of the substrate. The method includes providing a second device, which includes a second gate, a second source region, and a second drain region, on the second oxide layer on the second portion of the substrate. The method includes providing a third device, which includes a third gate, a third source region, and a third drain region, on the modified first oxide layer on the third portion of the substrate. The method includes depositing a protective oxide layer on a portion of the third gate and a portion of the third drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method for manufacturing a semiconductor device, the method comprising:
    depositing a first oxide layer on a first portion, a second portion, and a third portion of a substrate, wherein the first oxide layer is a sacrificial oxide layer for the first portion and the second portion of the substrate;
    depositing a first photoresist layer on the first oxide layer deposited on the third portion of the substrate;
    removing the first oxide layer from the first portion and the second portion of the substrate;
    removing the first photoresist layer from the first oxide layer deposited on the third portion of the substrate;
    depositing a second oxide layer on the first portion and the second portion of the substrate and on the first oxide layer deposited on the third portion of the substrate, wherein the first oxide layer and the second oxide layer on the third portion of the substrate define a modified first oxide layer on the third portion of the substrate;
    depositing a second photoresist layer on the modified first oxide layer and on the second oxide layer deposited on the second portion of the substrate;
    removing the second oxide layer deposited on the first portion of the substrate;
    depositing a third oxide layer on the first portion of the substrate after removing the second oxide layer deposited on the first portion of the substrate;
    removing the second photoresist layer after depositing the third oxide layer on the first portion of the substrate;
    providing a first device on the third oxide layer deposited on the first portion of the substrate;
    providing a second device on the second oxide layer deposited on the second portion of the substrate; and
    providing a third device on the modified first oxide layer deposited on the third portion of the substrate.

2. The method of claim 1, further comprising:
    implanting ions in the first portion and the second portion of the substrate to form ion-implanted portions of the substrate.

3. The method of claim 1, wherein the third device is a high voltage device.

4. The method of claim 1, wherein the modified first oxide layer is an in-situ steam generation oxide layer.

5. The method of claim 1, wherein providing the third device on the modified first oxide layer deposited on the third portion of the substrate comprises:
    forming a gate with spacers on the modified first oxide layer;
    implanting ions to form a source region and a drain region in the third portion of the substrate and on opposite sides of the gate;
    depositing a protective oxide layer on a portion of the gate and a portion of the drain region; and
    depositing silicide layers over portions of the gate, the source region, and the drain region except for the portion of the gate and the portion of the drain region covered by the protective oxide layer.

6. The method of claim 1, wherein:
    the first device is a core device,
    the second device is an input/output device, and
    the third device is a high voltage device.

7. The method of claim 1, wherein a thickness of the modified first oxide layer is greater than a thickness of the second oxide layer, and the thickness of the second oxide layer is greater than a thickness of the third oxide layer.

8. The method of claim 1, further comprising:
    forming a p-type body region and an n-type drift region in the third portion of the substrate.

9. The method of claim 1, further comprising:
    depositing a protective oxide layer on a portion of the third device.

10. A method for manufacturing a semiconductor device, the method comprising:
    utilizing in-situ steam generation to deposit a first oxide layer on a first portion, a second portion, and a third portion of a substrate, wherein the first oxide layer is a sacrificial oxide layer for the first portion and the second portion of the substrate;
    depositing a first photoresist layer on the first oxide layer provided on the third portion of the substrate;
    removing the first oxide layer from the first portion and the second portion of the substrate;
    removing the first photoresist layer from the first oxide layer deposited on the third portion of the substrate;
    depositing a second oxide layer on the first portion and the second portion of the substrate and on the first oxide layer deposited on the third portion of the substrate, wherein the first oxide layer and the second oxide layer on the third portion of the substrate define a modified first oxide layer on the third portion of the substrate;
    depositing a second photoresist layer on the modified first oxide layer and on the second oxide layer deposited on the second portion of the substrate;
    removing the second oxide layer deposited on the first portion of the substrate;
    depositing a third oxide layer on the first portion of the substrate after removing the second oxide layer deposited on the first portion of the substrate;
    removing the second photoresist layer after depositing the third oxide layer on the first portion of the substrate;

providing a first device, which includes a first gate, a first source region, and a first drain region, on the third oxide layer on the first portion of the substrate;

providing a second device, which includes a second gate, a second source region, and a second drain region, on the second oxide layer on the second portion of the substrate;

providing a third device, which includes a third gate, a third source region, and a third drain region, on the modified first oxide layer on the third portion of the substrate; and depositing a protective oxide layer on a portion of the third gate and a portion of the third drain region.

11. The method of claim 10, wherein:

the first gate, the first source region, and the first drain region define a core device for the semiconductor device;

the second gate, the second source region, and the second drain region define an input/output device for the semiconductor device; and the third gate, the third source region, and the third drain region define a high voltage device for the semiconductor device.

12. The method of claim 10, further comprising:

depositing silicide layers over portions of the first gate, the second gate, the third gate, the first source region, the second source region, the third source region, the first drain region, the second drain region, and the third drain region.

13. The method of claim 10, further comprising:

depositing silicide layers over portions of the third gate, the third source region, and the third drain region except for the portion of the third gate and the portion of the third drain region covered by the protective oxide layer.

14. The method of claim 10, wherein a thickness of the modified first oxide layer is greater than a thickness of the second oxide layer, and the thickness of the second oxide layer is greater than a thickness of the third oxide layer.

15. The method of claim 10, wherein the third device is a high voltage device.

16. The method of claim 10, wherein providing the third device on the modified first oxide layer deposited on the third portion of the substrate comprises:

forming the third gate with spacers on the modified first oxide layer; and implanting ions to form the third source region and the third drain region in the third portion of the substrate and on opposite sides of the third gate.

17. The method of claim 10, further comprising:

performing an ion implantation process to implant ions in the third portion of the substrate.

18. The method of claim 10, further comprising:

performing an ion implantation process to form a p-type body region and an n-type drift region in the third portion of the substrate.

19. The method of claim 10, further comprising:

depositing a pad oxide layer on the first portion, the second portion, and the third portion of the substrate;

depositing a third photoresist layer on the pad oxide layer provided on the first portion and the second portion of the substrate;

performing an ion implantation process to form a p-type body region and an n-type drift region in the third portion of the substrate;

removing the third photoresist layer and the pad oxide layer from the first portion and the second portion of the substrate; and removing the pad oxide layer from the third portion of the substrate; and wherein depositing the first oxide layer on the first portion, the second portion, and third portion of the substrate comprises:

depositing the first oxide layer on the first portion, the second portion, and third portion of the substrate based on removing the third photoresist layer and the pad oxide layer from the first portion and the second portion of the substrate and removing the pad oxide layer from the third portion of the substrate.

20. A method for manufacturing a semiconductor device, the method comprising:

utilizing in-situ steam generation to deposit a first oxide layer on a first portion, a second portion, and a third portion of a substrate, wherein the first oxide layer is a sacrificial oxide layer for the first portion and the second portion of the substrate;

depositing a first photoresist layer on the first oxide layer deposited on the third portion of the substrate;

performing an ion implantation process to implant ions in the first portion and the second portion of the substrate;

removing the first oxide layer from the first portion and the second portion of the substrate;

removing the first photoresist layer from the first oxide layer deposited on the third portion of the substrate;

depositing a second oxide layer on the first portion and the second portion of the substrate and on the first oxide layer deposited on the third portion of the substrate, wherein the first oxide layer and the second oxide layer on the third portion of the substrate define a modified first oxide layer on the third portion of the substrate;

depositing a second photoresist layer on the modified first oxide layer and on the second oxide layer deposited on the second portion of the substrate;

removing the second oxide layer deposited on the first portion of the substrate;

depositing a third oxide layer on the first portion of the substrate after removing the second oxide layer deposited on the first portion of the substrate;

removing the second photoresist layer after depositing the third oxide layer on the first portion of the substrate;

providing a first device, which includes a first gate, a first source region, and a first drain region, on the third oxide layer on the first portion of the substrate;

providing a second device, which includes a second gate, a second source region, and a second drain region, on the second oxide layer on the second portion of the substrate;

providing a third device, which includes a third gate, a third source region, and a third drain region, on the modified first oxide layer on the third portion of the substrate; and depositing a protective oxide layer on a portion of the third gate and a portion of the third drain region.

* * * * *